(12) United States Patent
Kwok

(10) Patent No.: US 6,300,763 B1
(45) Date of Patent: Oct. 9, 2001

(54) METHOD OF CALCULATING DYNAMIC STATE-OF-CHARGE WITHIN A BATTERY

(75) Inventor: Wellington Y. Kwok, Fishers, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/722,858

(22) Filed: Nov. 27, 2000

(51) Int. Cl.⁷ .......................... H01M 10/44; H01M 10/46
(52) U.S. Cl. ............................. 324/427; 320/132
(58) Field of Search ................... 320/127, 128, 320/132, 149, DIG. 21; 324/426, 427, 428, 433, 434

(56) References Cited

U.S. PATENT DOCUMENTS

| | | | |
|---|---|---|---|
| 4,876,513 | * 10/1989 | Brilmeyer et al. | 324/427 |
| 4,912,416 | * 3/1990 | Champlin | 324/426 X |
| 4,949,046 | * 8/1990 | Seyfang | 324/427 |
| 5,572,136 | * 11/1996 | Champlin | 324/426 |
| 5,585,728 | * 12/1996 | Champlin | 324/427 |

* cited by examiner

*Primary Examiner*—Edward H. Tso
(74) *Attorney, Agent, or Firm*—Margeret A. Dobrowitsky

(57) ABSTRACT

An apparatus and methods for determining dynamic state-of-charge of a battery that is subject to periodic charging and discharging within a system. Correction factors η are determined for various operational conditions of current, temperature and state of charge which relate relative discharge and charge efficiency with a reference set of conditions. According to conditions, the correction factor, either calculated in real-time or retrieved as a stored value, is then applied periodically to the charge and discharge currents of the battery to adjust an estimated state-of-charge value (SOC) for the battery within the given system.

38 Claims, 15 Drawing Sheets

METHOD OF CALCULATING DYNAMIC STATE-OF-CHARGE WITHIN A BATTERY

CROSS-REFERENCE TO RELATED APPLICATIONS

Not Applicable

STATEMENT REGARDING FEDERALLY SPONSORED RESEARCH OR DEVELOPMENT

Not Applicable

REFERENCE TO A MICROFICHE APPENDIX

Not Applicable

BACKGROUND OF THE INVENTION

1. Field of the Invention

The present invention generally pertains to battery power management and more particularly to a method of providing a correct approximation for the dynamic state-of-charge within a battery subject to dynamic charging and discharging.

2. Description of the Background Art

The tracking of battery energy is crucial within a variety of battery power management systems, such as those employed within internal-combustion and electric vehicles. Battery power management systems control the charging and/or discharging of a battery pack through a given load. In many of these applications, as typified by the electrical system of an internal combustion automobile, the battery is dynamically cycled between charging and discharging. During charging, it is important to track the battery energy to determine the optimum rate at which to charge the battery. During battery discharge it is important to recognize the relative amount of capacity remaining. Numerous drawbacks exist within typical methods utilized for battery energy tracking of a battery subject to charge/discharge cycling.

Batteries are typically charged at a variable rate, owing to the fact that rechargeable batteries can accept a higher charge current when fully depleted than when approaching a state of full-charge. A critical metric used within charging systems is that of a desired charge profile for a given battery type which specifies charge rate under a given set of conditions. A charge rate which is inadequate under a set of given circumstances increases the charge time, while a charge rate which is excessive under the given set of circumstances causes increased out-gassing and a reduction in battery longevity. Numerous charging methods have been used, therefore, to provide a charge rate suitable to the battery and its proper charging profile. For example, constant current chargers typically provide for a maximum charge current within a limited voltage, such that the current drops off as the battery approaches the upper voltage limit of the charger output. Determining a proper charging profile, however, is replete with conditional variables which increase complexity, and is further complicated by dynamic charging/discharging. However, it has been difficult to create advanced charging mechanisms that are more capable of properly charging the battery due in part to the difficulty with determining the current charge state of the battery. This is because the optimum charge rate of a battery may be considered largely dependent on its state-of-charge (SOC). A simple definition for state-of-charge (SOC) can be expressed as:

$$SOC = \frac{Q_r}{Q_n} \quad (1)$$

where $Q_r$ is the remaining capacity of the battery under the reference condition, and $Q_n$ is the nominal capacity of the battery (typically measured in ampere-hours, Ah) under test. Although, the concept of state-of-charge is relatively simple, the correct implementation is complicated as the determination of factors $Q_r$ and $Q_n$ require an in-depth understanding of the static and dynamic behavior within the battery. In literature on chargers and battery systems, it is common to find an algorithm which combines a set of multiple SOC definitions that are somehow bundled together to provide a final SOC calculation method. For instance, many investigators estimate the change in SOC by performing a simple current-time integration method such that $$\Delta SOC = \frac{(i \times \Delta t)}{Q_i} \quad (2)$$

where i is the charge or discharge current (in amperes, A), and $\Delta t$ is the time interval (in hours, h) and $Q_i$ is the battery capacity (ampere-hours, Ah) as determined at discharge current i. The calculation of SOC is thereby often given by:

$$SOC = SOC + \Delta SOC \quad (3)$$

However, use of this combination approach is fundamentally and mathematically erroneous and it provides no physical meaning. The summation of Eq. (1) and Eq. (2) into Eq. (3) is mathematically incompatible as these two equations describe two different fractions. The fraction of remaining capacity in terms of the nominal capacity is represented by Eq. (1), for instance based on a 20-hour rate, or $C_{20}$, while the fractional change in current-dependent capacity during the time interval is represented by Eq. (2). No physical information is provided by Eq. (3) as defined in Eq. (1) because one is unable to predict "remaining capacity" from the newly calculated SOC. In addition, any reference to the so-defined SOC function must be further quantified by specifying the discharge rate along with temperature.

A correlation has in other instances been derived in response to the Peukert equation:

$$Q_p = i^n t \quad (4)$$

where $Q_p$ is the characteristic battery capacity, n is the battery discharge rate sensitivity exponent, and t is the duration of discharge to specify an end-of-discharge condition. Therefore, the dynamics of Eq. (2) may be re-written as $$\Delta SOC = \frac{\Delta Q_p}{Q_n} = \frac{(i^n \times \Delta t)}{Q_n} \quad (5)$$

in order to incorporate the effect on capacity variation for different discharge currents according to the Peukert model. The resultant model assumes that the total increase, or decrease, in capacity (as determined by constant-current discharge) is directly proportional to the infinitesimal changes in usable capacity under dynamic conditions. In practice, this approach is widely accepted because of its ease of implementation even though it fails to relate the battery dynamics with the fundamental prediction of "remaining capacity" (or SOC). As a result, Eq. (5) is also mathematically inconsistent having $Q_p$ expressed in different units.

([Amp]×[hour]) is equated with [Amp]$^n$×[hour]). The Peukert model has also been found experimentally to provide an inadequate approach to accurately determining SOC within a dynamic system.

Therefore, a need exists for a method of properly determining, and/or maintaining state-of-charge (SOC) information for a battery being charged or discharged. The present invention satisfies that need, as well as others, and overcomes the deficiencies of previously developed charger solutions.

BRIEF SUMMARY OF THE INVENTION

The present invention provides an empirical method of determining an accurate approximation for the state-of-charge (SOC) in a battery under dynamic conditions of charge and discharge. This method utilizes an approach based on battery efficiency wherein efficiency correction factors are experimentally obtained and applied to measured charge and discharge rates under a set of conditions to accurately estimate the present SOC. The correction factor thereby generally describes the effectiveness of current transfer with the battery. Correction factors, or parameters from which correction factors may be calculated, are stored as a data set or in equation format. Under operational conditions the state-of-charge within the battery is calculated by using the correction factor according to the present conditions to correct the measured levels of current transfer with the battery over the time increment. The method provides for accurate estimation of charge state even if the system is subject to conditions of dynamic charging/discharging. Examples of systems which expose the battery to dynamic charge and discharging include: in-vehicle charging systems wherein the 12-volt battery is charged during highway driving and subject to various discharge levels while starting, idling, and slowing down; hybrid electric vehicles; and stop-start systems. These dynamic charge/discharge environments require the battery to cycle between storing energy and supplying energy. Practicing the method involves first normalizing batteries to a standard reference so as to provide a meaningful correlation under various operating conditions. The standard reference is a 20-hour rate discharge down to 10.5V at a temperature of 25° C. and all battery "activities" are to be normalized to this reference condition. The approximation in Eq. (2) is thereby replaced by the empirical correlation $$\Delta SOC = \frac{(\eta \times i \times \Delta t)}{Q_n} = \frac{\eta \times \Delta Q_i}{Q_n} \quad (6)$$

where η is a correction factor that mathematically relates the charging or discharging current i to the reference condition, and $\Delta Q_i = (i \times \Delta t)$ is the change in amp-hour capacity. The resulting state-of-charge (again given by SOC=SOC+ΔSOC) is thus reflected by the exact capacity retained within the battery under the reference conditions. All currents are further simplified by substituting $$\frac{i}{Q_n}$$

with a normalized term or equivalent current, φ, such that $$\varphi = \frac{i}{Q_n} \quad (7)$$

which allows the derived correlation to be applied to batteries of similar design, which may, for instance, have similar active mass, P/N ratio, mass-to-acid ratio. Furthermore the correlation may be applied to aged batteries of the same design which exhibit a linear reduction in useful capacity.

During charging, the charge correction factor is closely related to the battery charge acceptance. The charge acceptance capability of the battery diminishes rapidly due to mass-transfer and material limitations as the battery approaches its full-charge state. Temporal integration of charging current, therefore, generally leads to an unrealistic estimate of SOC which may exceed 100%. Numerical errors of this nature may be easily overcome within certain applications, such as laboratory testing and certain electric vehicle applications, which are not subject to dynamic charging and discharging. In these non-dynamic battery systems, numerical integration continues until the calculated charge state reaches a pre-determined "degree of overcharge" threshold, such as 105% to 125%, whereupon the SOC meter is reset to 100% prior to subsequent discharge or cycling tests. In this way the method corrects to a "known" state of full-charge. However, this direct integration technique introduces significant cumulative errors depending on input charge rates and SOC when used within automotive and other dynamic applications in which full-charge conditions are rarely attained. Typical in-vehicle automotive SOC calculations thereby manifest appreciable errors and lack the ability of being periodically initialized since the SOC rarely attains a known stable full charge value.

The effect of battery discharge rate on SOC calculations is commonly neglected even though they play an important role in accurate SOC estimation. Discharge at a low-rate generally promotes uniform material conversion within an electrode which is primarily considered to occur due to gradual diffusion of electrolyte into the pore space and slow electrochemical reaction. In contrast, high-rate discharge generally leads to incomplete conversion largely involving only surface material, due largely to the formation of lead-sulfate particles on electrode surfaces which can physically prevent electrolyte from penetrating into the electrode interior, such that usable capacity of the battery is effectively reduced. Direct integration of discharging current therefore provides an overestimate of the useful capacity of the battery.

An object of the invention is to provide a method for tracking battery state-of-charge under dynamic conditions of charging and discharging.

Another object of the invention is to consider the rate at which the battery is being discharged when calculating battery state-of-charge.

Another object of the invention is to provide a method in which calculation errors may be easily corrected within systems which employ the inventive methods.

Another object of the invention is to accurately approximate small changes in battery state-of-charge during both charging and discharging.

Another object of the invention is to simplify calculations performed within a charging system.

Another object of the invention is to provide for calculating state-of-charge by utilizing correction factors determined from simulated operating conditions.

Another object of the invention is to provide for calculating state-of-charge by utilizing correction factors which are calculated in real-time based on battery characteristics whose parameters were stored for the calculation.

Another object of the invention is to provide normalization techniques which allow for application of the inventive techniques over a wide range of battery types, sizes, and conditions.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only.

DETAILED DESCRIPTION OF THE INVENTION

Referring more specifically to the drawings, for illustrative purposes the present invention is embodied in the apparatus generally shown in FIG. 1 through FIG. 15. It will be appreciated that the apparatus may vary as to configuration and as to details of the parts, and that the method may vary as to the specific steps and sequence, without departing from the basic concepts as disclosed herein.

Figure 1:
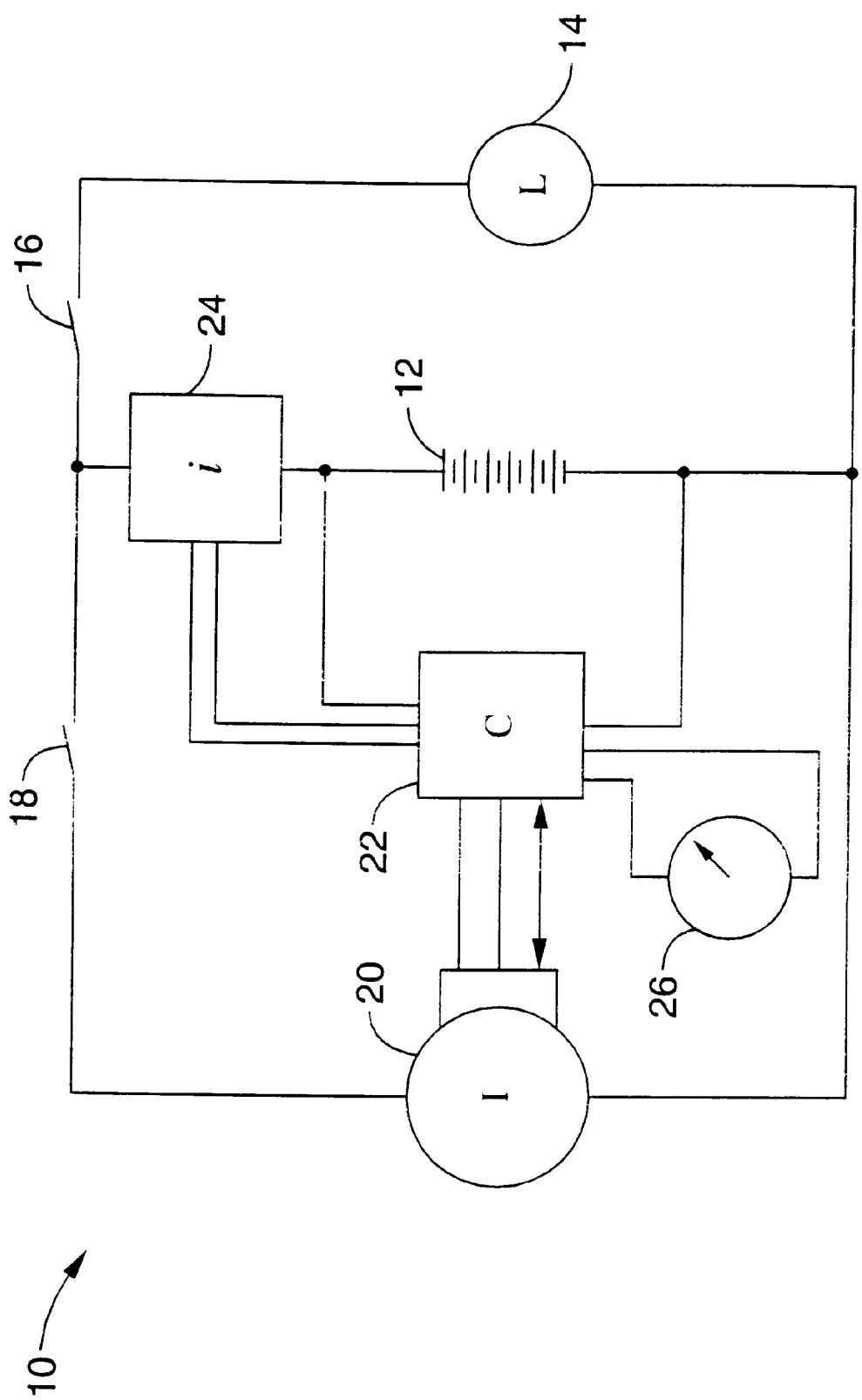
FIG. 1 is simplified schematic of a battery power-system containing an electrical power system controller utilizing the method for calculating state-of-charge within a battery system according to the present invention.

The present invention provides for determining and/or maintaining a measurement of the state-of-charge within a battery as a result of tracking battery energy inputs and outputs which are determined by applying correction factors to time increments of measured charge and discharge currents. The present invention is applicable to a variety of battery chemistries as it operates in relation to common electrochemical principles. FIG. 1 shows a battery power-system 10 which is typical of an application in which a battery is capable of supplying energy to a load and being recharged by a current source. Power is drawn from a battery pack 12 which is connected to a load 14. The load 14 may represent any device being supplied with electrical power, such as an electric starter of an automobile, electrical accessories, motors, and so forth. Optional switches 16, 18 are typically used in off-line charging applications, such as in electric vehicles, wherein the battery is either being charged or providing power to the load. The charger comprises a programmable current source 20 that supplies charging current to battery 12 and a power management system controller 22 which is shown having a set of voltage inputs and a current measurement input from a current measurement sensor 24 (or shunt resistor), which allows the controller to provide concomitant control of current source 20 during the charging operation, and communicate battery information to external equipment, for example the state-of-charge indicator 26. The method for determining SOC within the present invention is typified as being implemented within the controller 22 of the system so that proper charging of the battery pack 12 may be performed, while preferably the estimated state-of-charge is also registered on the SOC indicator 26. It should be appreciated that the state-of-charge determination methods provided may in addition be utilized for numerous and varied purposes within systems associated with a battery capable of being recharged.

Figure 2:
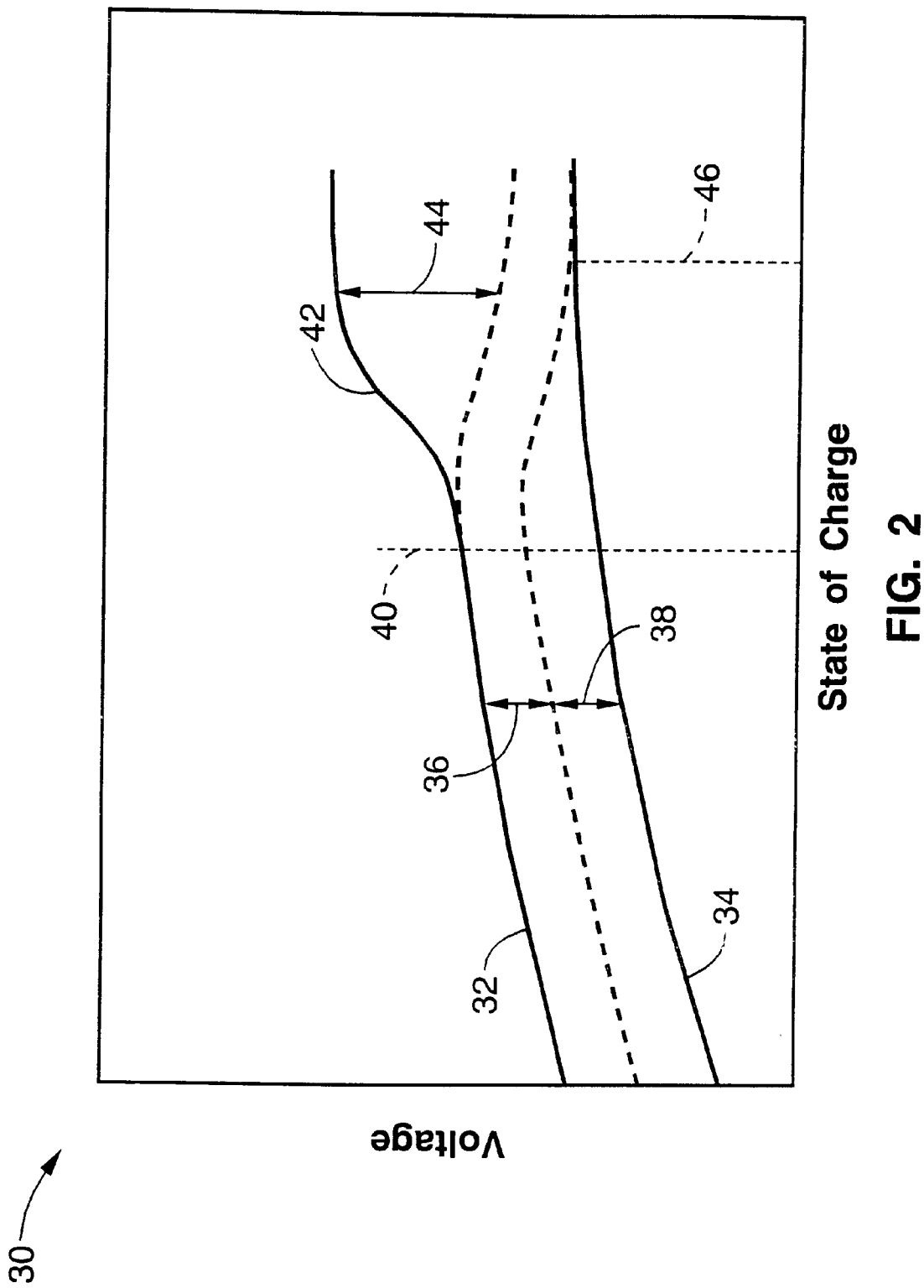
FIG. 2 is a graph of battery voltage as a function of state-of-charge within a battery being charged.

FIG. 2 typifies a plot 30 of battery voltage as a function of state-of-charge (SOC) for a battery charged by the constant-current (Cl) method. The measured battery voltage 32 tracks the equilibrium voltage 34, the difference of potentials being accounted for by a combination of ohmic drop 36 and polarization 38. The measured voltage generally follows the Tafel relationship up to a gassing point 40, which typically occurs between 50% and 80% SOC depending on the applied current. Within the voltage plot it should be appreciated that the contribution to voltage drop from ohmic resistance remains relatively constant. The sudden increase in the measured voltage 42 coincides with a corresponding decrease in charge acceptance capability due to depletion of active reaction sites and physical blockage of acid diffusion due to the production of gas bubbles, such that a condition of high apparent resistance occurs. Therefore, the effective charging current that induces chemical and ionic polarization at the surface of electrodes is accordingly reduced. An overcharge potential 44 is considered to exist in this region of curve divergence as the battery charging energy increasingly is consumed within the overcharge reactions as opposed to useful electrochemical conversion in approaching a 100% state-of-charge level 46.

Figure 3:
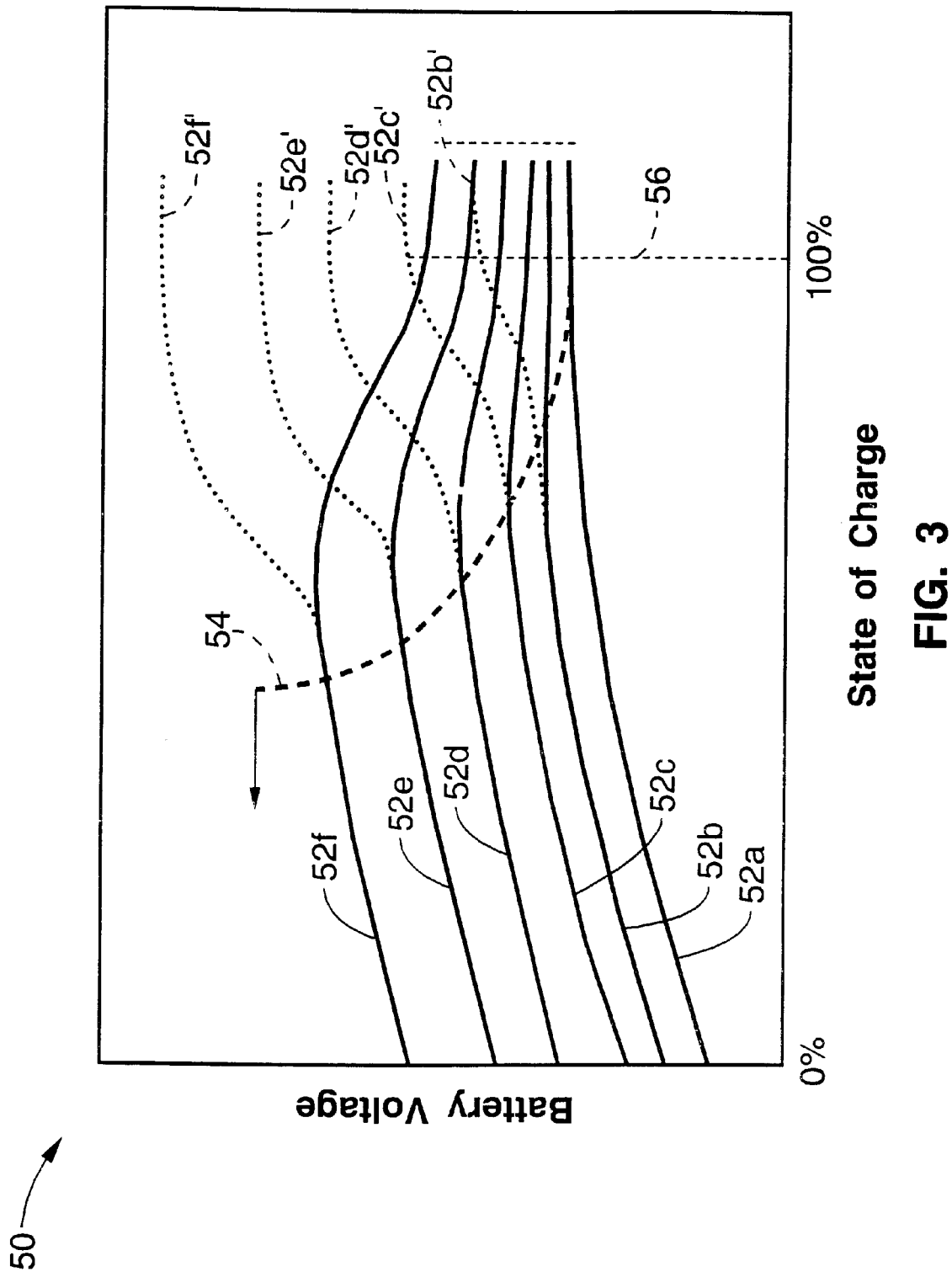
FIG. 3 is a graph of material conversion efficiency wherein a set of charge voltage profiles are shown as a function of the state-of-charge within the battery.

FIG. 3 depicts 50 the analogous effects on charge efficiency in terms of effective charge voltage curves 52a through 52f, associated with specific charge current levels, shown as a function of SOC. The "effective charge voltage" is the driving potential which corresponds with the level of charge current which is being accepted by the battery, and which is not going towards overcharge reactions within the battery. Voltage profiles 52a through 52f portray the aggregate ohmic and polarization voltages in response to varying levels of charge current, with the upper-most plot 52f representing the highest of these applied charging currents, while curve 52a represents the battery equilibrium voltage. It will be apparent from the curves, that at low SOC values the charge efficiency is nearly 100%, as the majority of energy input is utilized for material conversion. As the battery approaches its full state-of-charge, an increasing portion of the input energy is diverted to overcharge reactions and ohmic heating. The dashed lines 52b' through 52f represent the measured charge voltage which is substantially the sum of the effective polarization and the overcharge potential. The effective polarization may be largely characterized by charge-transfer, concentration, and ohmic contributions. The initial point of inflection of the charging voltage curves indicates the onset of overcharging which is determined largely by the level of charging current. A dashed-line 54, shown intersecting the curves 52b–52f, indicates the initial point of voltage inflection on each curve, wherein larger charging currents diverge at lower values of SOC reflecting an according loss of charge efficiency. Upon attaining a full state-of-charge 56 (100% SOC), any additional energy input to the battery is diverted into promoting non-material conversion activities such that the resultant charge efficiency drops to almost zero.

Accordingly, a charge efficiency correction factor, $\eta_c$ can be determined as $$\eta_c = \frac{\varphi_{\mathit{eff}}}{\varphi_c} \tag{8}$$

where $\phi_{\mathit{eff}}$ is the effective charging current for material conversion only, and $\phi_c$ is the applied charging current. Both of the terms are expressed in accord with normalized current as defined in Eq. (7).

Corresponding to any given SOC within FIG. 3, a consequent maximum, or "critical", charging current $Q_{critical}$ exists below which the charge efficiency is substantially 100%. Increasing the charging current at a given SOC above this critical current causes a corresponding decrease in charge efficiency. Therefore, it may generally be considered that the effective charge current is equivalent to the critical current which allows Eq. (8) to be approximated by:

$$\eta_c(\phi, \varphi_c) = \frac{\varphi_{critical}(\phi)}{\varphi_c} \tag{9}$$

It should be recognized, that as the charge current is reduced, the charging process becomes increasingly efficient and theoretically approaches 100% efficiency at an infinitely low level of applied charge current.

Figure 4:
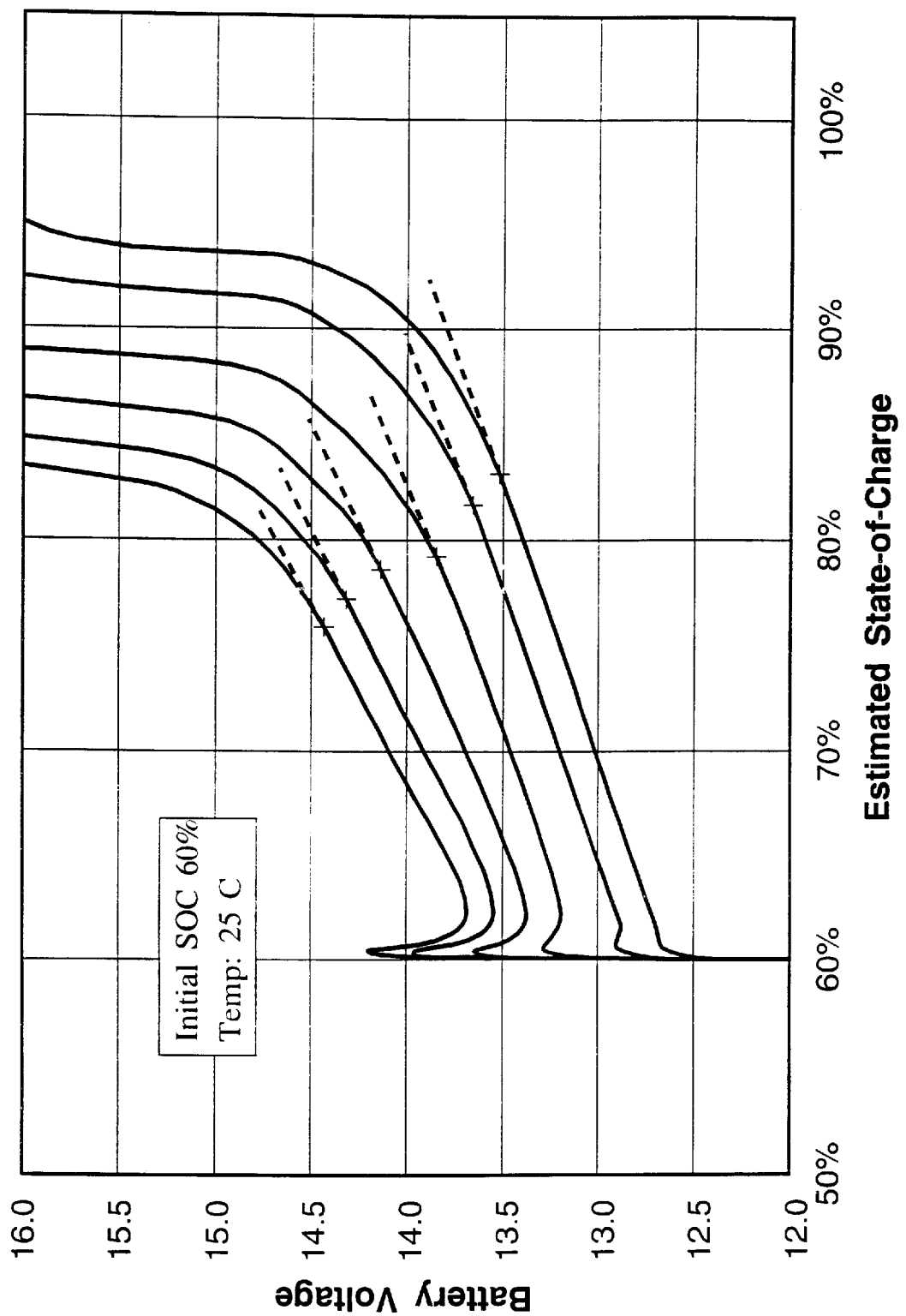
FIG. 4 is a graph of battery voltage as a function of state-of-charge within the battery at a temperature of 25° C., in which the onset of overcharging is illustrated.
Figure 5:
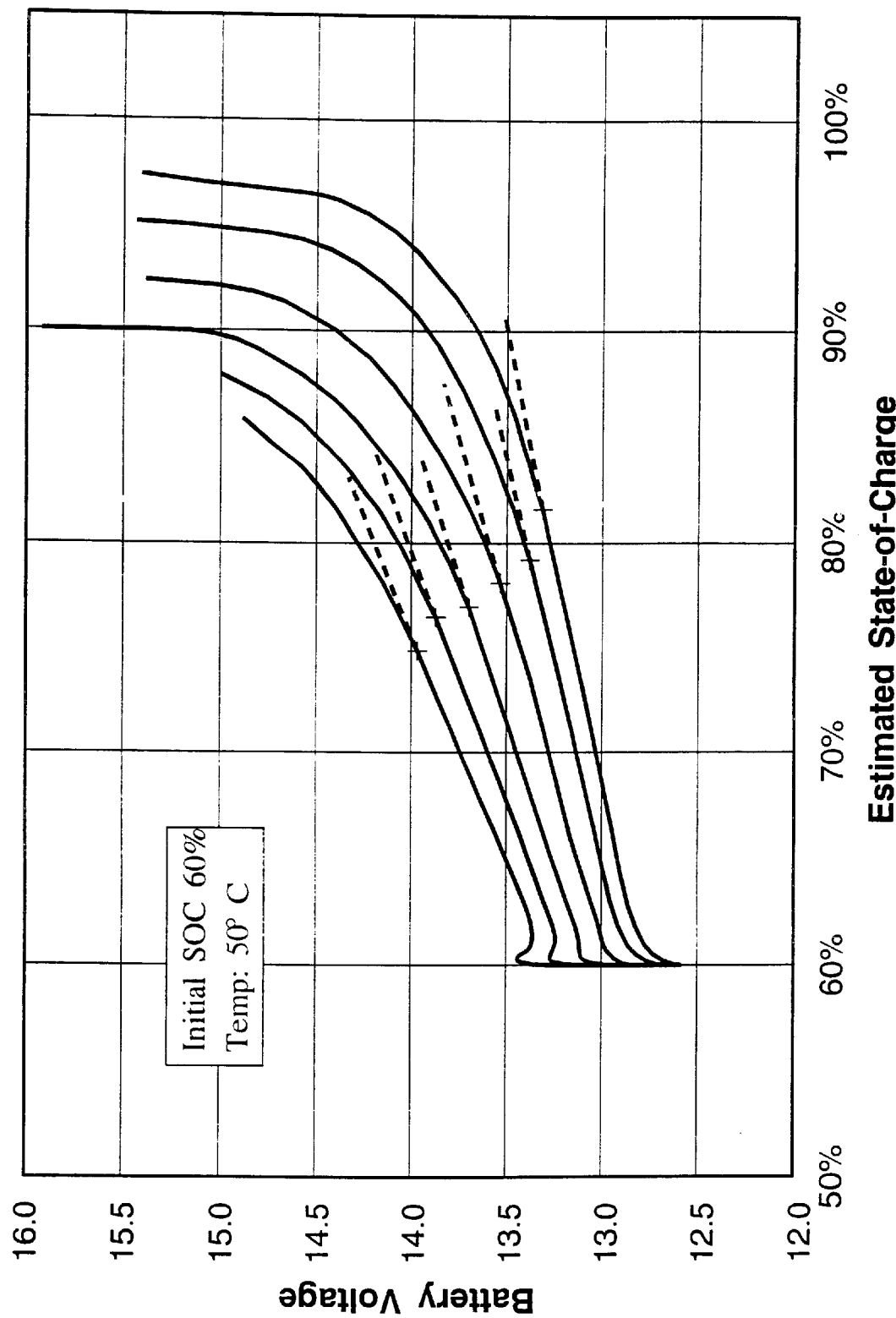
FIG. 5 is a graph of battery voltage as a function of state-of-charge within the battery at a temperature of 50° C., in which the onset of overcharging is illustrated.

The critical point, at which overcharging reactions rise rapidly, may be determined experimentally during charging of the battery from the constant-current charging profiles illustrated in FIG. 4 and FIG. 5 which were performed from an initial SOC of 60% and recharged at temperatures of 25° C. in FIG. 4, and 50° C. in FIG. 5. The test batteries within these experiments were first discharged to about 60% SOC and subsequent to a rest period of at least eight hours were recharged at rates of 3.45, 7.5, 15, 25, 35 and 45 amperes. The corresponding charge voltage profiles were recorded using a high-speed data acquisition system and plotted against the estimated SOC for the battery. The onset-of-overcharge condition as illustrated by the markers within FIG. 4 and FIG. 5 was determined "manually" by extending the linear portion of each voltage profile and reading off the corresponding SOC at the point-of-inflection. Alternatively, the point-of-inflection may be determined by means of calculations performed on the voltage profile data or by carefully monitoring the gas flow rate.

Figure 6:
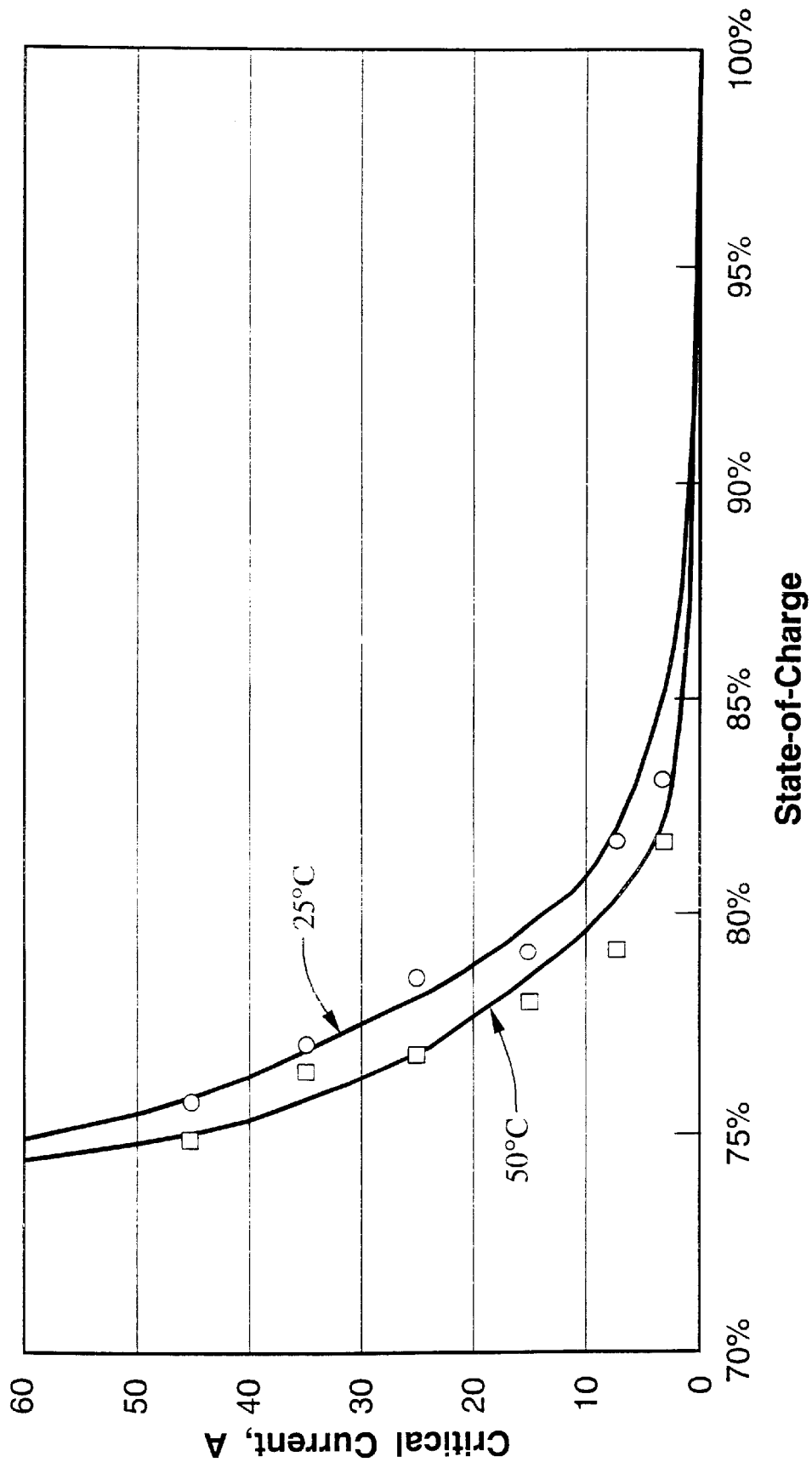
FIG. 6 is a graph of critical charging current within a battery as a function of state-of-charge.

FIG. 6 summarizes critical charging current as a function of battery SOC at both 25° C. and at 50° C. The plot denotes the specific charge current at any specific value of state-of-charge at which overcharging commences. The critical charging current is important for determining charge efficiency as a function of state-of-charge. Mathematically, the critical charging current can be expressed as a continuous function as $$\ln \phi_{critical} = \alpha_0 + \alpha_1 \ln \phi \tag{10}$$

where $\phi_{critical}$ is the normalized critical current at the corresponding SOC $\phi$, and $\alpha_0$ along with $\alpha_1$ are the empirical coefficients. The regression curves for 25° C. and 50° C. as shown in FIG. 6 follow according to the equations $$\ln \phi_{critical} = -6.4799 - (22.2485 \ln \phi) \text{ [at 25° C.]} \tag{11}$$

$$\ln \phi_{critical} = -7.6485 - (25.4385 \ln \phi) \text{ [at 50° C.]} \tag{12}$$

and the estimated charge correction factors $\eta_c$ are summarized in Table 1. In referring to Table 1, it should be remembered that the normalized charging current is the applied charging current divided by the battery capacity, such that 0.05 equates to a charge rate of C/20 while 1.0 equates to a rate of C. It will be appreciated that the critical value of current may be directly calculated from the Eq. (10) as follows:

$$\phi_{critical} = e^{\alpha_0 + \alpha_1 \ln \phi} \tag{13}$$

The critical current may then be related to the normalized charging current to determine the charging correction factor as follows:

$$\eta_c = \phi_{critical} / \phi_{normal} \tag{14}$$

These correction values thus derived may be stored or calculated "on-the-fly" and applied incrementally to correct state-of-charge based on charge currents under the specific operating conditions.

Determining a set of discharge correction factors $\eta_d$ is a more complex process than the determination of charge correction factors $\eta_c$. Remaining consistent with the definition for SOC used herein, as defined in Eq. (1), it is necessary to reference SOC values to the "remaining capacities" in a battery with respect to the nominal capacity of the battery under the given reference conditions.

By way of example, a 50 Ah (ampere-hour) battery whose capacity is based on a 20-hour discharge rate, or "$C_{20}$-rate", is utilized as a reference. A consideration of an 80% SOC level within the battery refers to the charge state at which this battery is able to deliver 2.5A for exactly 16 hours before reaching 10.5V. By way of further example, the SOC of the same battery after discharging at a constant current rate of approximately 20A for 20 minutes is determined by discharging the remaining capacity of the battery at the reference current of 2.5 A until the voltage drops to 10.5V which is defined in Eq. (1). Therefore, the discharge correction factor $\eta_d$ which is defined in Eq. (6) can be expressed as the ratio of "the equivalent capacity removed under standard conditions" to "the integrated capacity removed under the specific operating conditions", which is given by:

$$\eta_d = \frac{\Delta Q_r}{\Delta Q_i} \quad (15)$$

It should be emphasized that the determination above is valid only for infinitesimal capacity changes, and that otherwise the resultant equation becomes the mathematical equivalent of Eq. (2) upon substitution into Eq. (6).

Figure 7:
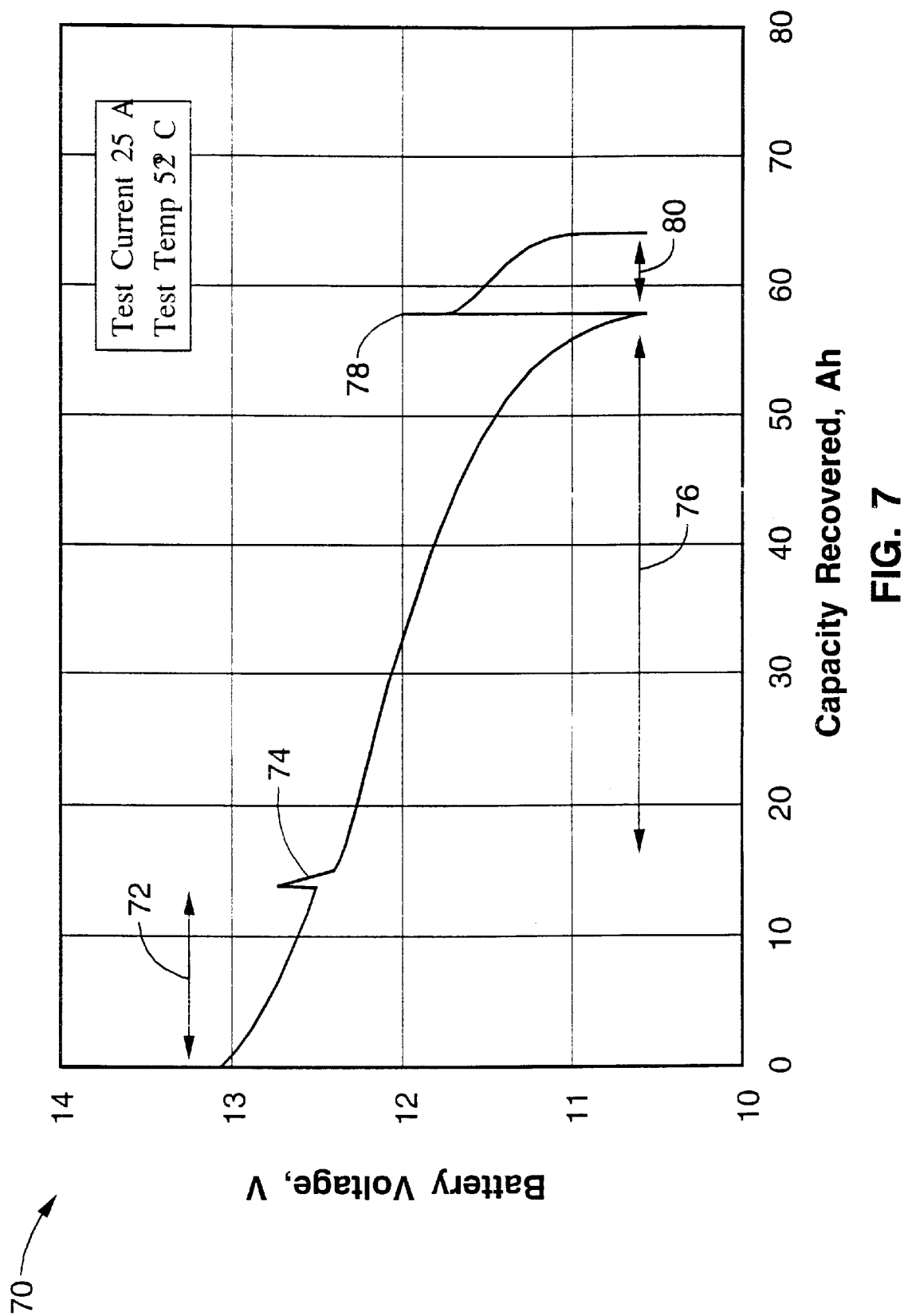
FIG. 7 is a graph of battery voltage and capacity in which steps are illustrated for determining battery discharge correction factors.

The discharge capacity, under any condition, may be related to the reference capacity by means of empirical testing wherein it is assumed that (1) the change in battery performance is a linear function of the capacity removed, and (2) the battery conditions at the end of discharging are identical for each level of discharge current. FIG. 7 illustrates a battery voltage profile in response to the experimental sequence described below for estimating a correction factor, $\eta_d$ while discharging the test battery at a 25A rate at a temperature of 52° C. from an initial 80% SOC. The test battery undergoes discharging $\eta$ at a $C_{20}$-rate to a predetermined SOC at 25° C. (standard reference condition) while the removed ampere-hour capacity is recorded as $Q_1$. According to the product specification, a nominal 20 HR capacity of 69 Ah, i.e., $C_{20}$-rate equal to 3.45 A, was used in this step in preparing the battery for this initial state. Remaining capacity, $Q_2$, is then calculated by subtracting the capacity removed $Q_1$ from the nominal capacity value given for the battery. The battery is allowed to rest 74 for a period of eight hours at 25° C. to attain equilibrium, after which the battery is provided with an additional eight hours of rest at 52° C. to heat-soak to a final temperature. The first eight-hour rest period is performed to provide an equivalent equilibrium state for all units. Preferably a load, such as 20 mA, is connected to the battery during the last eight-hours prior to testing so as to simulate the parasitic loading which exists within a vehicle power-system. A reasonable load value range would typically be from 15 to 200 mA, with the higher values accommodating sophisticated equipment, such as security systems and tracking systems. Discharging 76 of the battery is then performed at the predetermined test current until the measured battery voltage reaches 10.5V while the removed amp-hour capacity is recorded as $Q_3$. The battery is returned to the standard reference condition 78 of 25° C. and allowed to rest for at least eight hours. Finally, battery discharging 80 at a $C_{20}$-rate is performed until the voltage has dropped to 10.5V which determines the remaining capacity $Q_4$.

FIG. 8 through FIG. 12 illustrate a complete empirical test matrix in which discharge correction factors were determined at five different temperatures (−29° C., −18° C., 0° C., 25° C. and 52° C.) and five discharge rates (3.45, 10, 25, 35 and 45 amps). Each test was conducted in the same sequence, with the exception that for tests at temperature at or below 0° C., the rest periods were extended to 16 hours.

The initial SOC is calculated based on the estimated remaining capacity $Q_2$:

$$SOC_{initial} = \left(\frac{Q_2}{Q_n}\right) \times 100\% = \left[\frac{Q_n - Q_1}{Q_n}\right] \times 100\% \quad (16)$$

In this equation $Q_n$ is determined using linear interpolation from the decrease in capacity as observed during the initial cycles, $$Q_n = Q_n^0 \times (\Delta Q_n \times n_{cycle}) \quad (17)$$

where $Q_n^0$ is the initial capacity of a new battery (=63.37±1.23 Ah), $\Delta Q_n$ is the average capacity decline per deep-discharge cycle (~−1.529 Ah / cycle), and $N_{cycle}$ is the number of cycles. The final SOC at the end of test discharge is calculated by $$SOC_{final} = \left(\frac{Q_4}{Q_n}\right) \times 100\% \quad (18)$$

Figure 8:
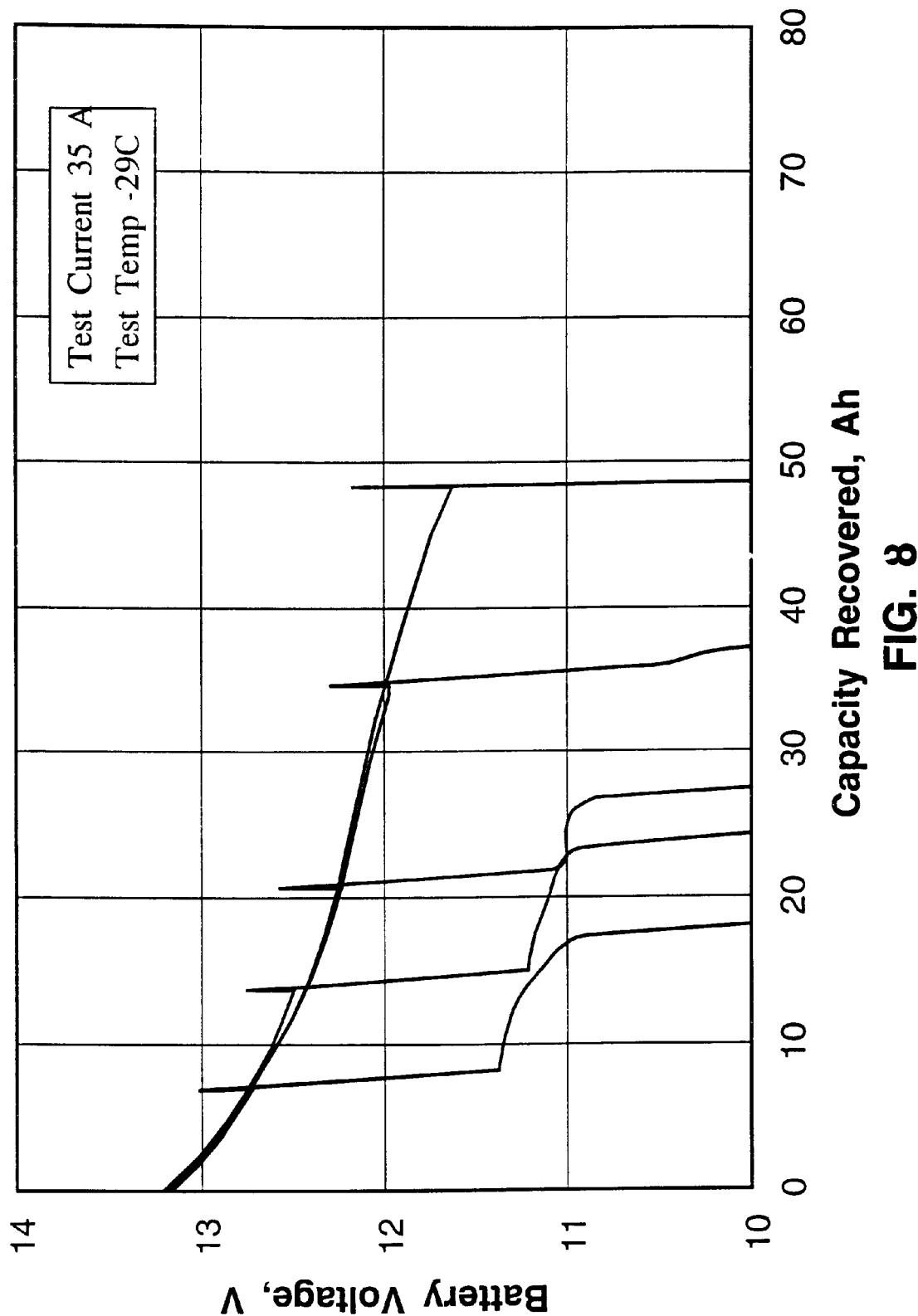
FIG. 8 is a graph of battery voltage and recovered capacity during discharging at a temperature of −29° C.
Figure 9:
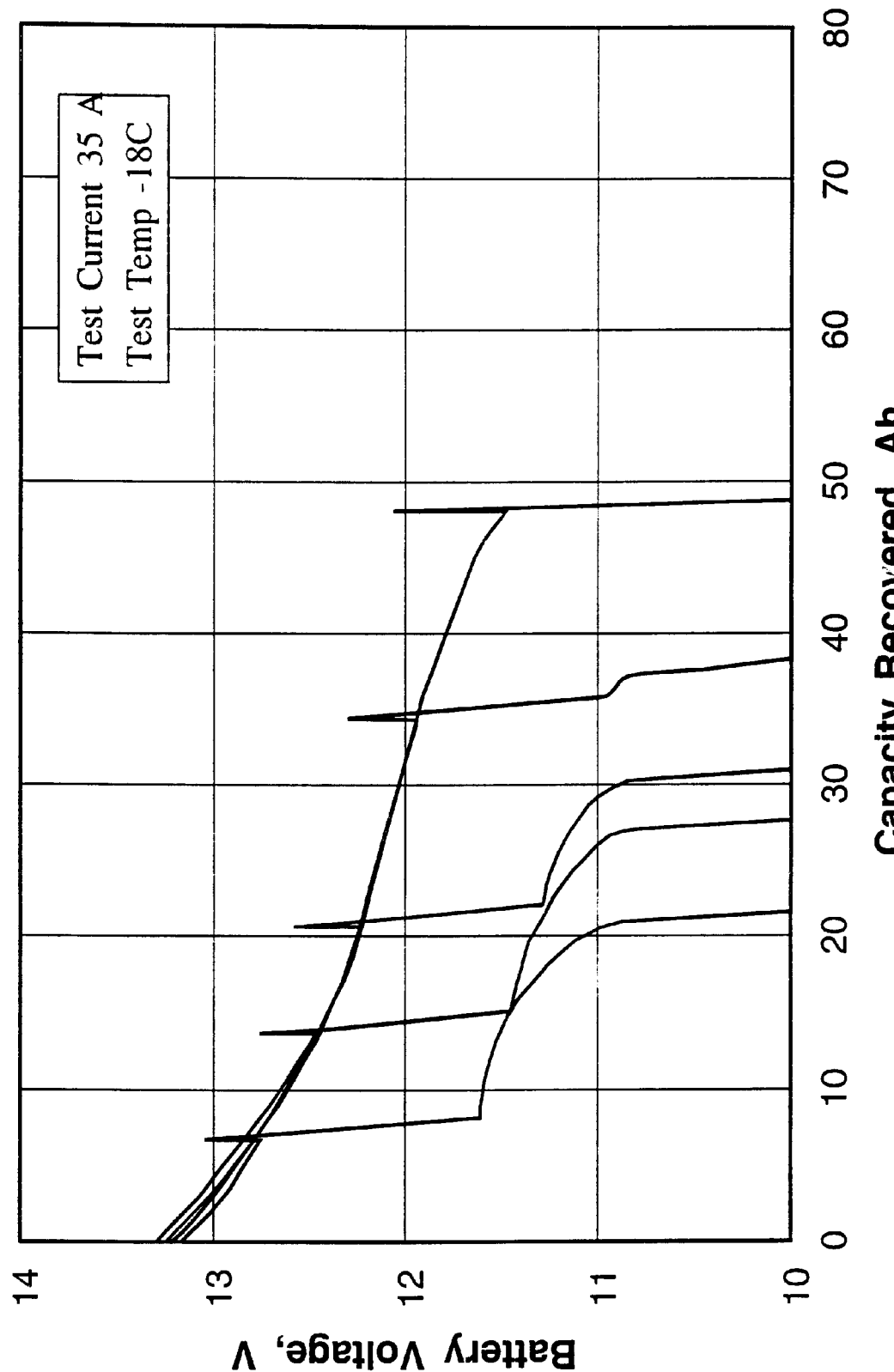
FIG. 9 is a graph of battery voltage and recovered capacity during discharging at a temperature of −18° C.
Figure 10:
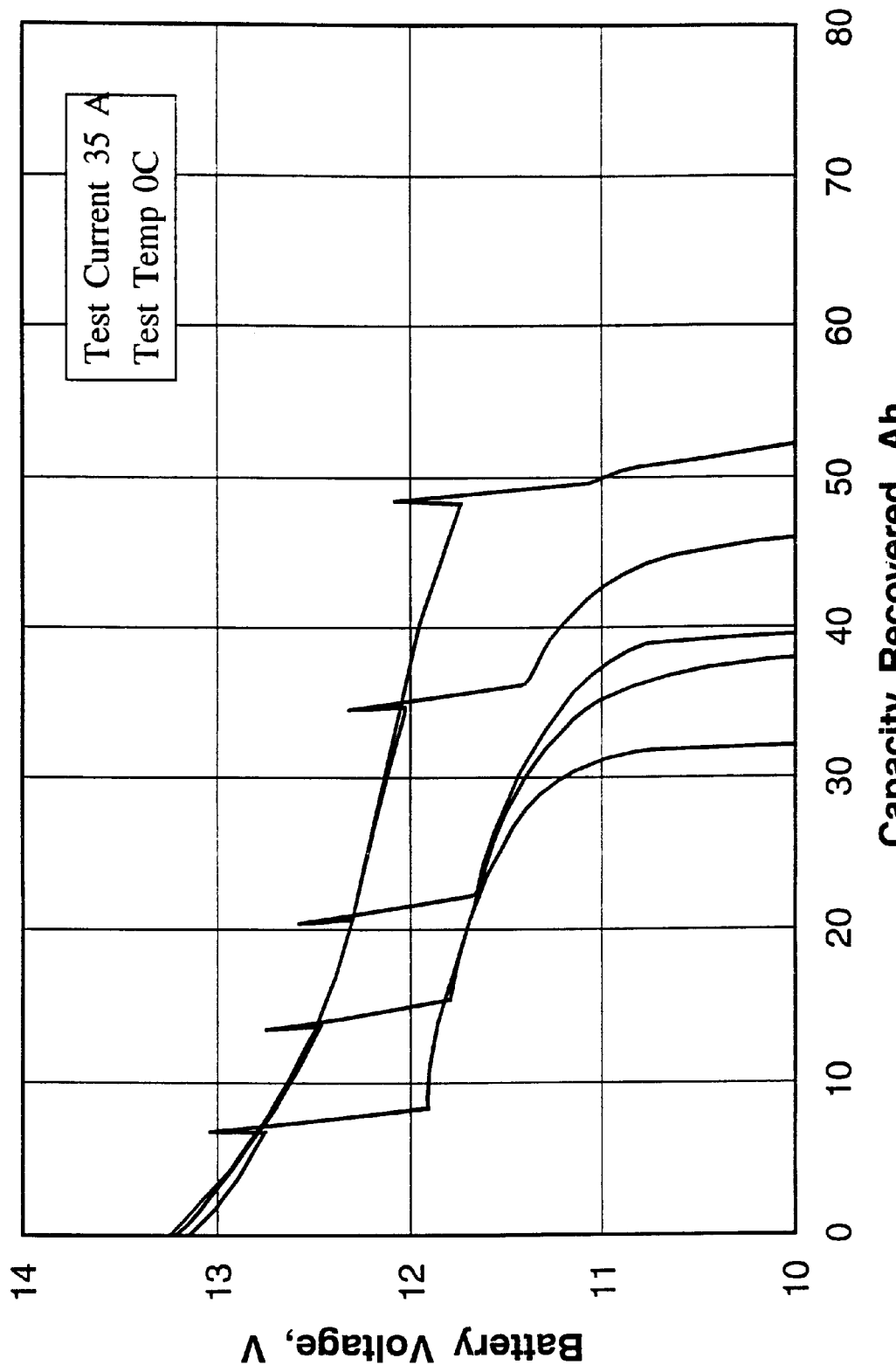
FIG. 10 is a graph of battery voltage and recovered capacity during discharging at a temperature of 0° C.
Figure 11:
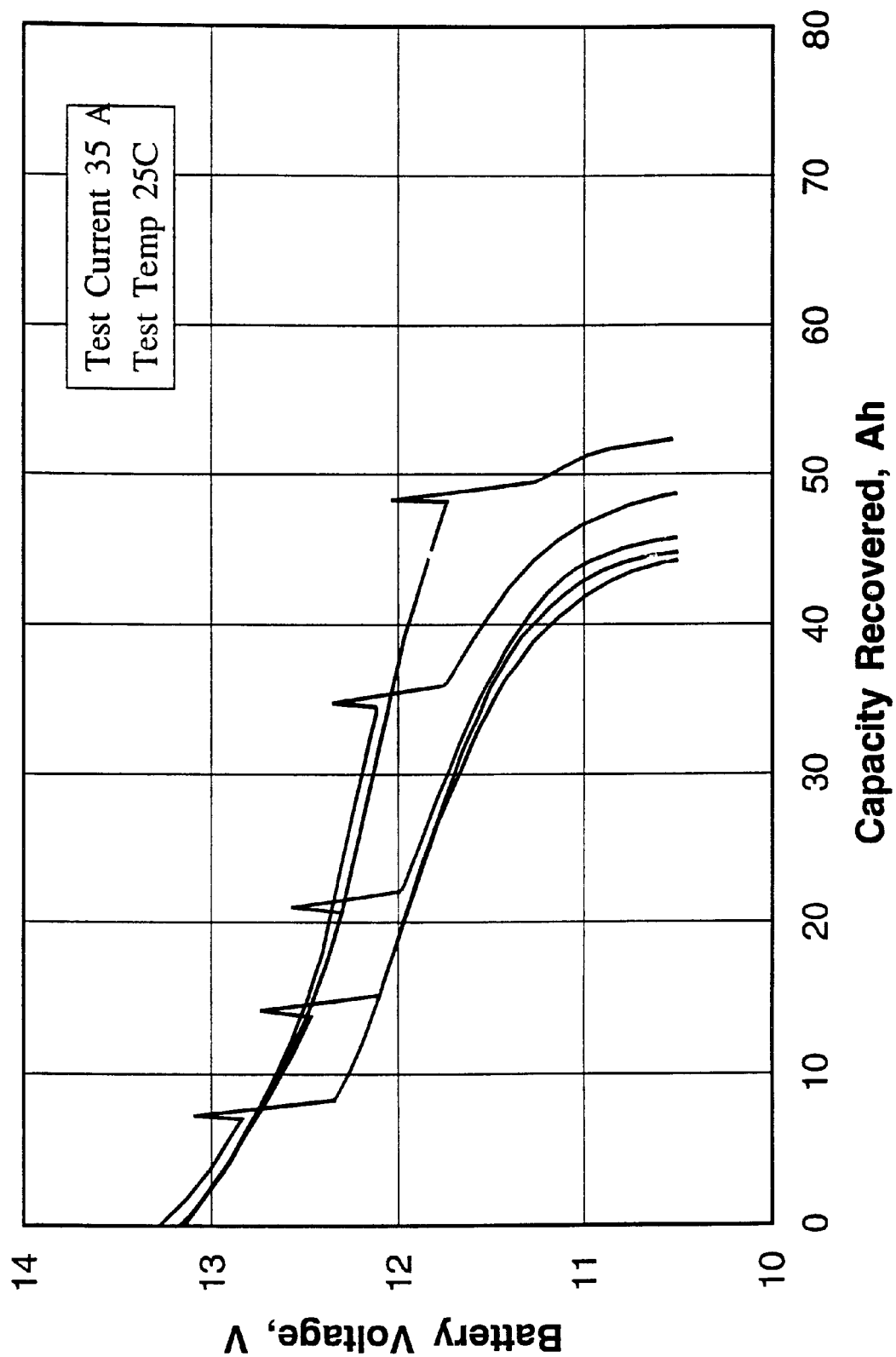
FIG. 11 is a graph of battery voltage and recovered capacity during discharging at a temperature of 25° C.
Figure 12:
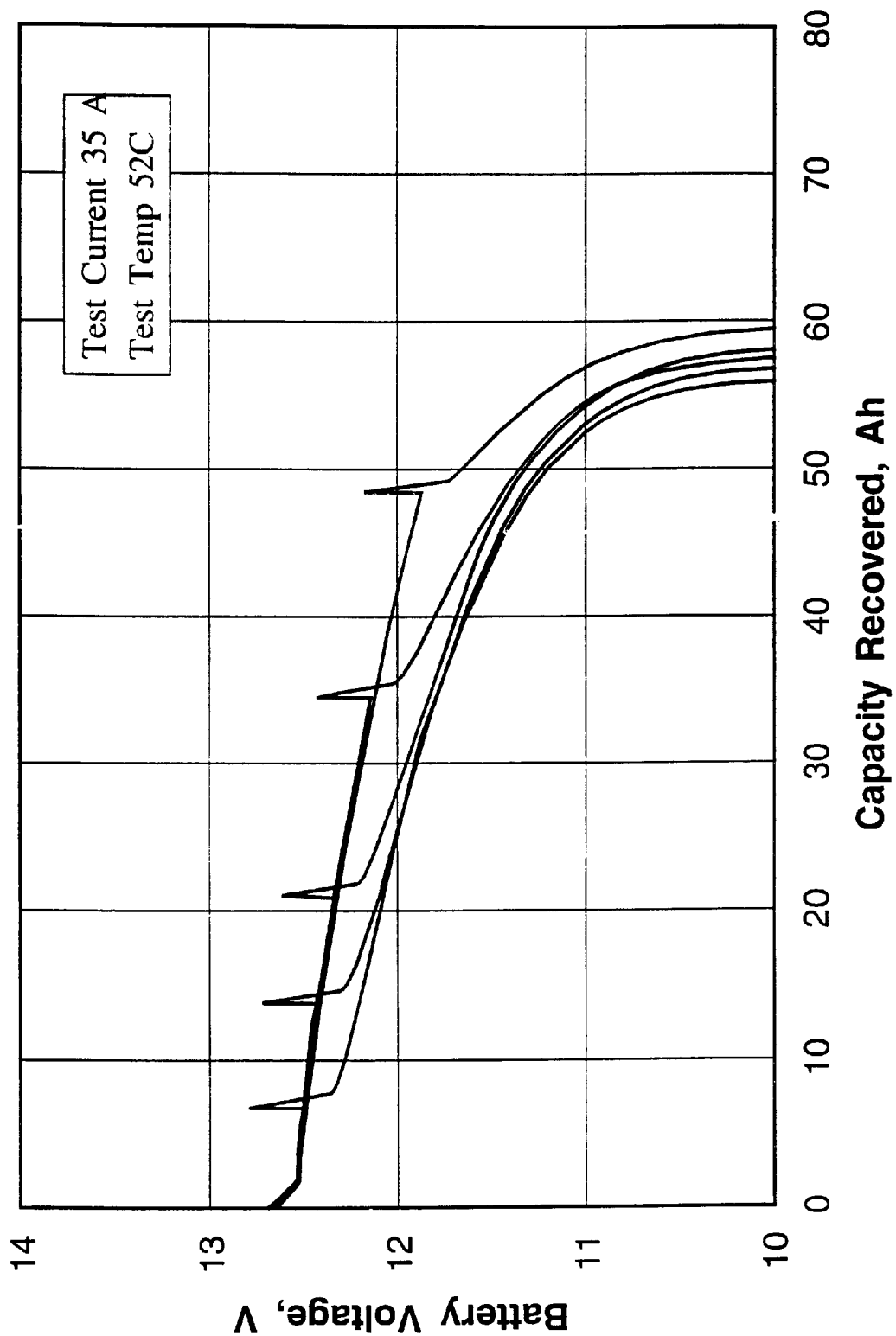
FIG. 12 is a graph of battery voltage and recovered capacity during discharging at a temperature of 52° C.

An example of the 35-amp discharge test at five different temperatures is illustrated in FIG. 8, wherein the data points from Steps 4 and 5 are omitted in the graph to improve visibility. At high temperature, the battery can be discharged at a relatively high rate, measured in ampere-hours, even at a low SOC. As the temperature is reduced to sub-freezing levels, the ability of the battery to delivery high-discharge rates diminishes and at low SOC levels at temperatures well below zero the battery may only be capable of delivering meager discharge currents. The relationship between the (c-coverable capacity and discharge rate loosely follows the linear Peukert model, although it markedly failed to exhibit a stable behavior as would be expected at each SOC level. As described previously, the Peukert approach also fails to predict the final SOC (based on $C_{20}$-rate) once the battery reaches the end-of-discharge condition and it additionally does not relate to finite SOC changes under dynamic conditions.

Accordingly, any change in the reference SOC may be determined in terms of the discharge correction factor as stated in Eq. (15) for different discharge rates and temperatures. This factor can be approximated from our experimental data as follow:

$$\eta_d = \frac{\Delta Q_r}{\Delta Q_i} \cong \frac{Q_2 - Q_4}{Q_3} \quad (19)$$

where the term $(Q_2-Q_4)$ represents the expected capacity available under the standard reference condition. i.e., 25° C. and $C_{20}$-rate, for this battery discharging from the same initial SOC to the same final SOC. The expected capacity is then divided by the measured capacity removed under the test conditions $Q_3$. In practice, discharge rates are generally higher than the reference conditions, which results in a lower material conversion efficiency and consequently a discharge correction factor which is normally greater than unity, except when operating at high-temperature. Stated alternately, a large discharge correction factor $\eta_d$ indicates a poor material conversion efficiency during discharge relative to the reference discharge conditions. A description is presented in Table 2 of the physical regimes under which different ranges of discharge correction factor, $\eta_d$, may be obtained. Table 3A and 3B, provide illustrative examples of discharge correction factors determined for the reference batteries in each test.

The Peukert correlations, as described, do not provide a mechanism for determining battery capacity in a system that is subject to variations in discharge currents at differing SOC levels. However, the present invention provides for applying the Peukert correlations over infinitesimal intervals and applying stored parameters based on the conditions of temperature, discharge rate, and state-of-charge to determine correction factors. By applying the correlation using this method a good approximation of the correction factor may be determined. The Peukert correlation is given by:

$$\eta = \gamma_0 + \gamma_1 \ln\phi + \gamma_2 \ln\phi \quad (20)$$

The parameters $\gamma_0$, $\gamma_1$, and $\gamma_2$ describe the first and second-order relations of the battery capacity with respect to SOC and discharge rate in logarithmic terms, while $\phi$ is the discharge current and $\varphi$ is the present state-of-charge. If the charging current is lower than the critical charging current (at which overcharging begins), as determined by Eq. (10), then the charging efficiency is considered 100% with a correction factor of one. A set of regression coefficients were determined for the same set of batteries; these coefficients are listed in Table 4. It will be appreciated that these corrections may be calculated "on-the-fly" within an operational system, or as a means for creating a matrix of stored correction factors.

Figure 13:
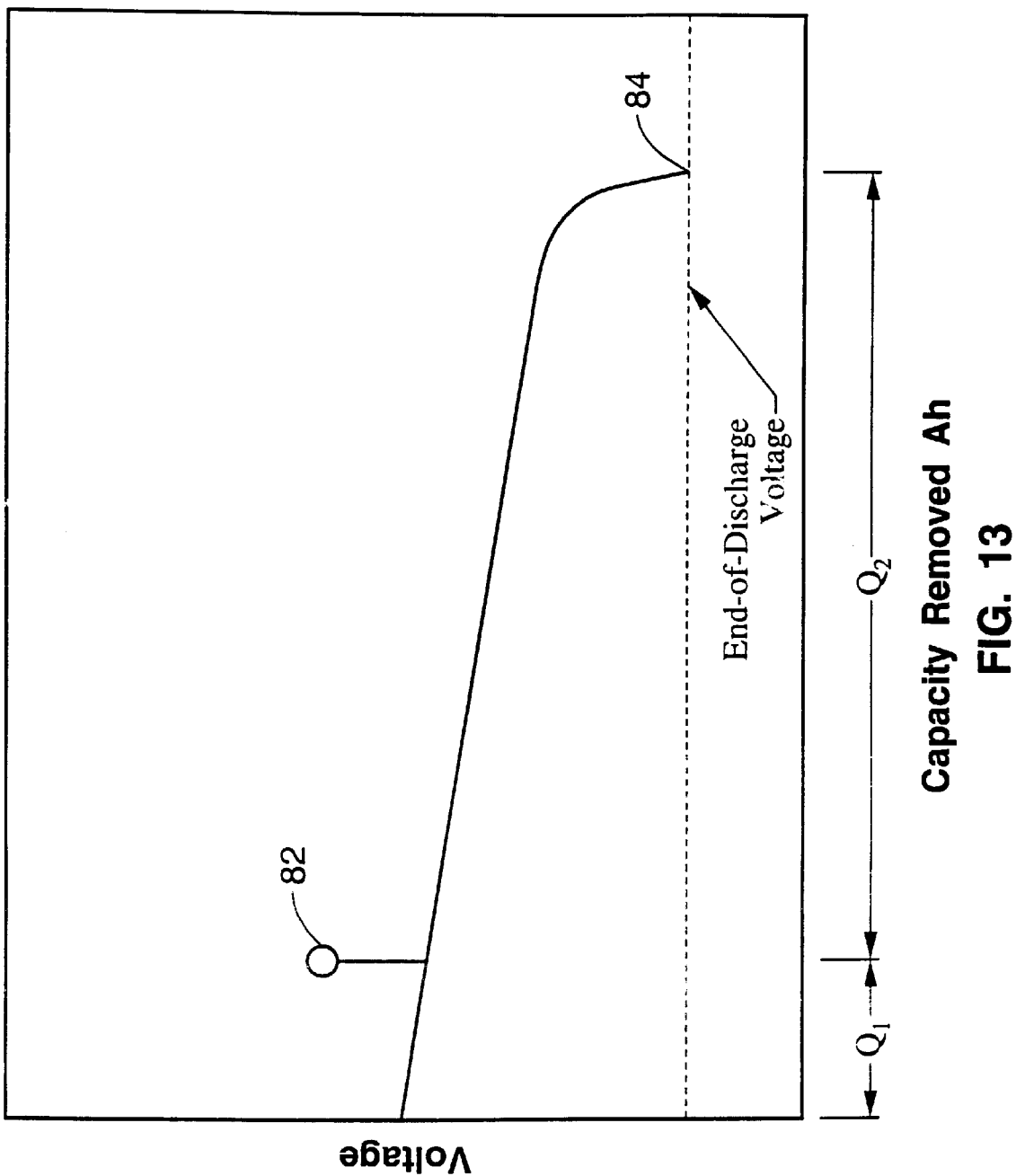
FIG. 13 is a graph of battery discharge under reference conditions for an alternative method of determining the discharge correction factor.
Figure 14:
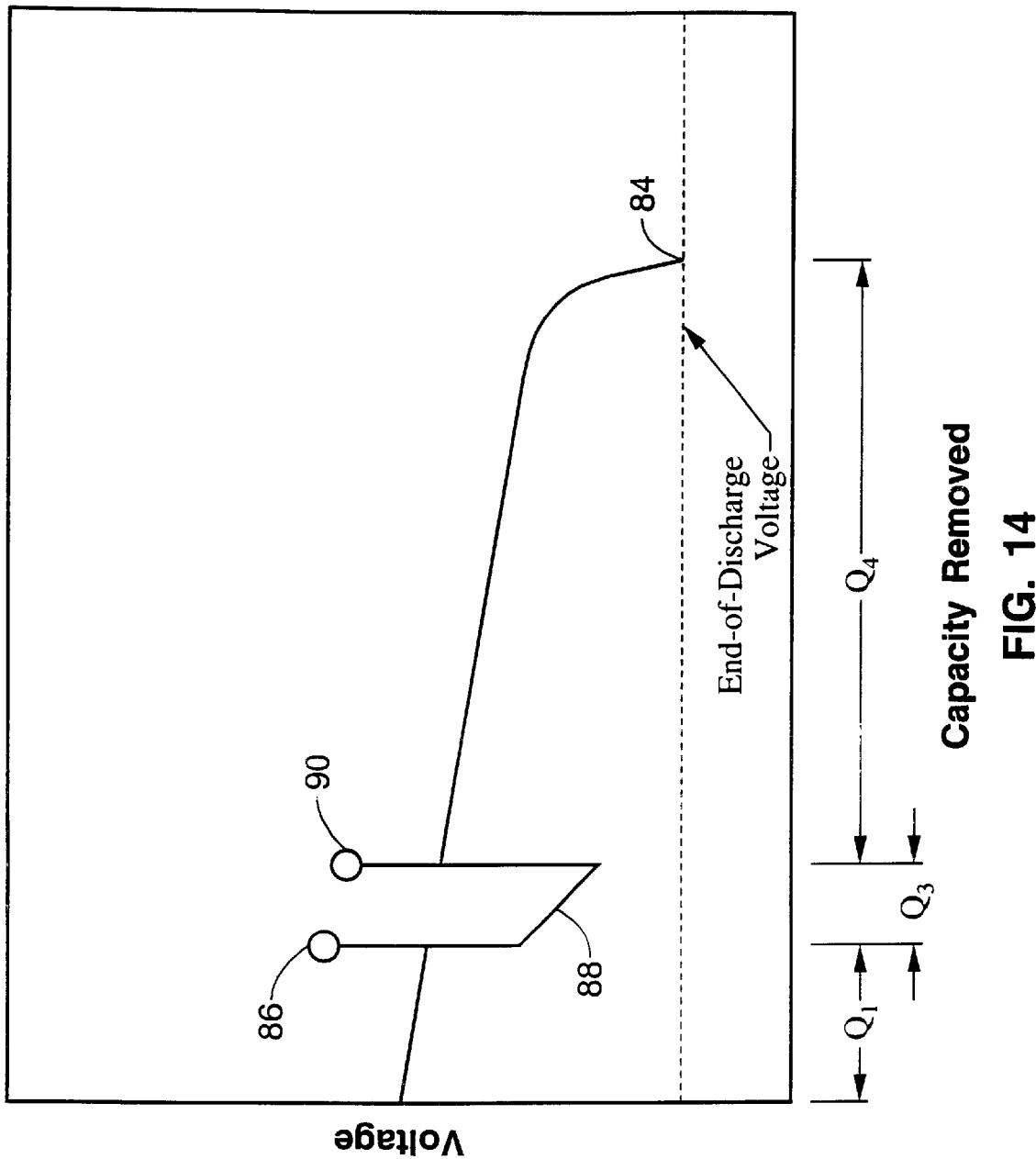
FIG. 14 is a graph of battery discharge under test conditions for use in conjunction with the data from FIG. 13.

Another method of determining the discharge correction factor $\eta_d$ can be performed which does not rely on a calculated battery capacity to determine remaining capacity. FIG. 13 and FIG. 14 illustrate discharge profiles in which the discharge correction factor $\eta_d$ is experimentally derived using a pair of identical batteries which were fully charged prior to commencement of the tests. The voltage curve in FIG. 13 depicts discharging a battery under a set of reference conditions, which are exemplified as a $C_{20}$ discharge rate at a temperature of 25° C. to a predetermined ampere-hour state 82, wherein a capacity loss $Q_1$ is recorded. After the battery is allowed to rest and equilibrate, discharging again proceeds until the battery reaches a predetermined end of discharge condition 84 wherein a capacity loss $Q_2$ is recorded. It will be recognized therefore that the nominal capacity for the battery is given by $Q_1+Q_2$ under the reference conditions. FIG. 14 illustrates discharging an identical battery under a mixture of reference and non-reference conditions. The second battery is subjected to an identical initial discharge and rest interval 86 which should yield an identical $Q_1$. After reaching equilibrium, the second battery is then discharged for an interval at any given test condition of discharge rate and temperature while the capacity removed under the test condition, $\Delta Q_i$, is recorded as $Q_3$. After a suitable rest period to achieve equilibrium, the battery is then discharged to the end of discharge threshold at the reference conditions while the capacity loss $Q_4$ is recorded. The equivalent capacity loss under the reference discharge conditions is the difference $(Q_2-Q_4)$ which approximates the difference in remaining capacity as if the second battery were discharged under the reference conditions. Relating the two measures of capacity loss thereby can provide a discharge correction factor $\eta_d$ as per Eq. (19) for the given conditions under which $Q_3$ was recorded. By testing a matrix of discharge rates and temperatures while recording $Q_3$, an empirical model of $\eta_d$ under each condition may be constructed. These correction factors may then be used to populate a three-dimensional look-up table or a regression function which provides a value for $\eta_d$ as a function of state-of-charge, temperature, and discharge rate.

Accurately comparing the capacities to arrive at a conversion factor requires a repeatable end of discharge point. A voltage level of 10.5 volts is used as an end of discharge threshold for the test depicted in FIG. 13 and FIG. 14. It will be recognized that alternative discharge thresholds, such as a predetermined ampere-hour capacity, may be utilized.

During capacity testing of the batteries, a consistent rest interval is provided to allow the batteries to attain an equilibrium state so that a proper comparison will be provided. The rest period is exemplified as eight hours within the above tests. The rest periods of the second battery are provided with a temperature soaking time prior to testing at non-reference conditions which allows the battery to stabilize at the non-reference temperature of the test, and a temperature soaking interval which commences after the test to stabilize the battery back again at the reference temperature.

Recalling that discharge correction factors relate the capacity under reference conditions to the capacity under a given set of conditions, it will be appreciated in consideration of Eq. (15), that for a given level of discharge current, the discharge correction factors qd are typically greater than unity for tests performed at low-temperature ($\Delta Q_r > \Delta Q_i$) and less than unity for the tests performed at high-temperature, with the calculated values being in the range of 0.8 to 1.5. Under extreme conditions, such as low-temperature and a high-discharge rate, the values of the discharge correction factor $\eta_d$ are not reported due to the limited capability and accuracy of calculating minor amp-hour changes and approximating $Q_n$.

The general trend for discharge correction factor $\eta_d$ at a fixed temperature is exhibited as a decreasing function of decreasing SOC, whereby the material conversion during the discharge process is less effective for a battery starting at a high SOC level than for a battery starting at a lower SOC level. The observed trend appears reasonable since a battery charged or prepared to a high SOC is expected to have higher kinetic rates than a battery at a low SOC due to the presence of more unreacted active mass and the presence of a higher electrolyte concentration. These higher kinetic rates lead to rapid material conversion and thus quickly reduce the active reaction surface thereby leading to physical blockage due to increased molecular volume. Furthermore, as the operating temperature is reduced, the rate of electrolyte diffusion from the surrounding interface with the electrolyte-active mass is further reduced. Therefore, it also appears reasonable that the observed trend would be more pronounced at low temperatures than at high temperatures.

At low battery SOC levels the kinetic rates are relatively small, (i.e. due to a low concentration of reactive materials) and these kinetic rates appear to become comparable with the rate of electrolyte diffusion. Due to the slower kinetic rates and absence of unreacted active mass, material conversion is forced to proceed not only at the surface but also inside the electrodes. For example, as active material is converted from the charge state to a discharge state, $PbO_2$ and $Pb$ are converted to $PbSO_4$, wherein sufficient time is available for electrolyte from the surrounding areas to penetrate deeply and more evenly into the electrode interiors which lead to an increase of effective material conversion (i.e. where discharge efficiency approaches the reference conditions and correction factor $\eta_n$ thereby approaches unity).

A slight reduction in the discharge correction factor $\eta_d$ values may have occurred due to the battery testing procedure. It should be appreciated that each battery was prepared to the approximate SOC by removing a predetermined amp-hour measure of capacity from a fully charged battery at $C_{20}$-rate, which may artificially promote the even distribution of reactive area within the electrodes. In addition, during low temperature testing the battery was allowed to reach equilibrium over an extended interval to aid the electrolyte soaking process.

The amount of battery self-discharge taking place during the rest periods may have additionally introduced a skew into the discharge correction factor $\eta_d$ calculation by reducing the measured $Q_2$ and $Q_4$ values which thereby result in a diminished discharge correction factor $\eta_d$. The skew effect may be further exacerbated at high temperatures and low state-of-charge levels. Battery self-discharge effect taken individually, however, cannot explain the decrease in calculated discharge correction factor efficiency $\eta_d$ values observed from −18° C. to −29° C.

It should be appreciated that this unexpected "decrease" of the discharge correction factor $\eta_d$ helps to confirm the emphasis within the present invention on monitoring incremental capacity changes instead of total capacity changes. In reference to the discharge plots of FIG. 7, it should be recognized that the end-of-discharge conditions are very different for 0° C., 25° C., and 52° C., than the end-of-discharge conditions found −18° C. and −29° C. While the battery is at high temperatures the ability to deliver energy decreases gradually as active material is slowly converted, as is depicted by the smooth voltage profiles and material conversion within the electrode is substantially steady. As the test temperature decreases to sub-zero regimes, however, the end-of-discharge becomes more abrupt, which is typically the result of electrolyte that is at a near-freezing temperature which limits the transport of active ions to the interface and thereby reduces conductivity. The location of material conversion is essentially limited to the electrolyte-electrode interface. The relationships are further complicated as the freezing temperature of the electrolyte is subject to change as may be typified by a change in electrolyte concentration.

As will be appreciated, the test results provide a reasonable approximation of incremental changes in battery capacity ($\Delta Q_i$) at moderate-to-high temperatures. The correction factors which were applied to the ampere-hour increments (measured current x time increment) in the description above, were generally described as being taken from lookup tables. However, the invention may be practiced readily by calculating the correction factors in real-time, "on-the-fly", and then applying the values to the ampere hour increments. The following program code is provided by way of example and not of limitation for deriving correction factors during either charging or discharging.

```
If Current >= 0 then
# Charge
    iNorm = Current/NomCapacity
    (alfa0, alfa1) = funcChrgParameter(Temp)
    iCrit = Exp(alfa0 + alfa1 * LN(Soc))
    CorrFac = ((iCrit < iNorm) ? iCrit/iNorm : 1.0)
Else
# Discharge
    iNorm = Current/NomCapacity
    (gama0, gama1, gama2) = funcDschrgParameter(Temp)
    CorrFac = gama0 + gama1 * LN(iNorm) + gama2 * LN(Soc)
Endif
IF Current = 0 then CorrFac = 1
```

The charge/discharge efficiency method derived for the present invention provides a mathematically consistent correlation that renders the described practical methods for determining the battery SOC under dynamic conditions. The correction factors as shown may be applied from a table dimensioned to match the measured conditions, or determined "on the fly" as described above. In either case, an accurate state-of-charge estimation may be maintained even for a battery that is subject to extremely dynamic conditions of charging and discharging.

Figure 15:
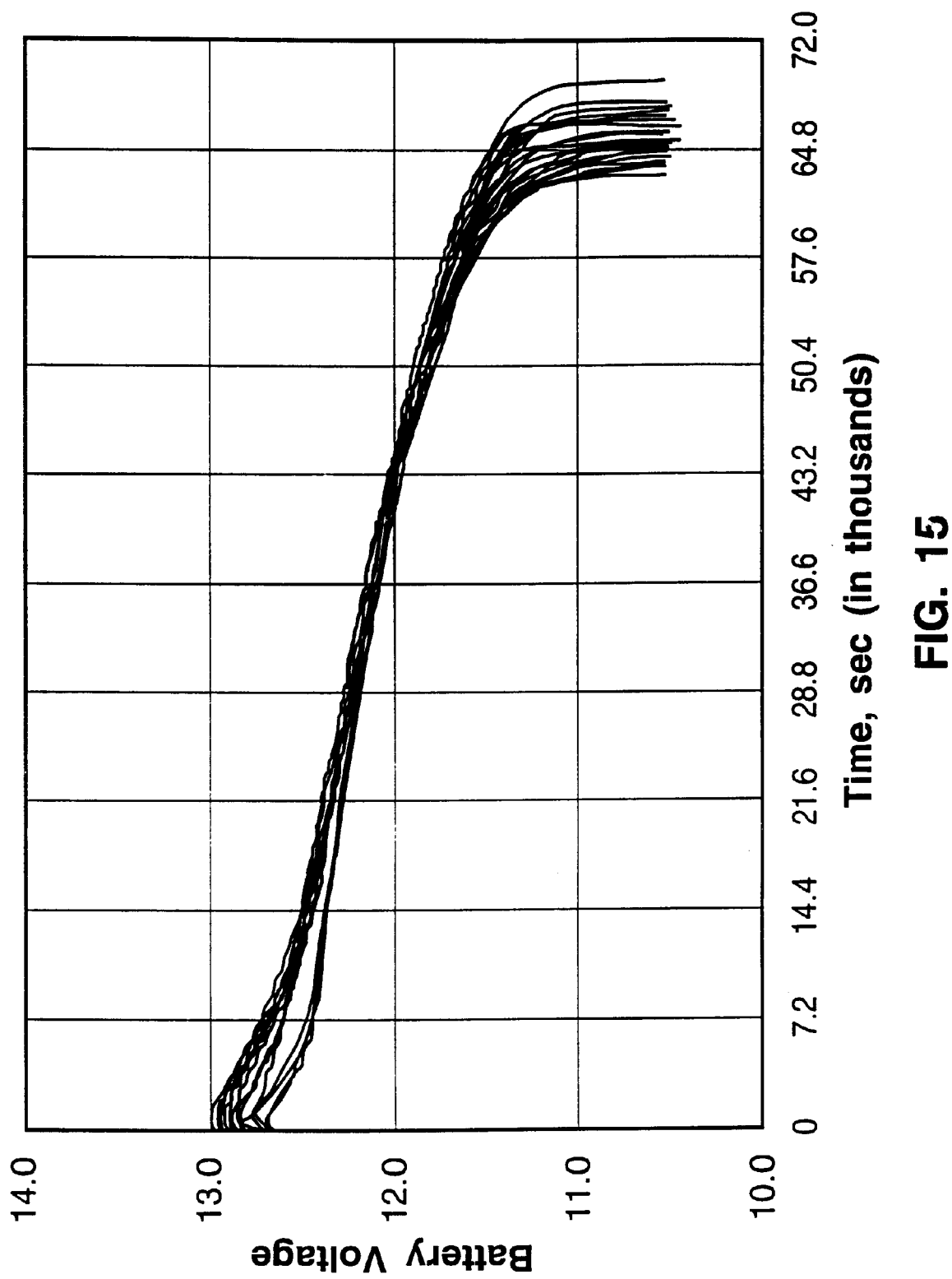
FIG. 15 is a graph of battery voltage as a function of discharge time for a series of batteries to illustrate average discharge capacity.

It should be recognized that approximating actual battery capacity as the nominal capacity leads to cumulative errors with respect to battery aging. In Eq. (17), a value for this cycling capacity loss factor was introduced (−1.529 Ah/cycle). Significant declines in usable battery capacity occur as a result of deep-cycle testing, for example, batteries used for automotive starter, lighting, and ignition (SLI batteries), which typically exhibit a significant capacity loss per year. It will be appreciated that a constant value for nominal capacity $Q_n$ is no longer completely accurate after one or two deep-discharge cycles. To assess the decline of nominal capacity due to deep cycling, testing was performed on a group of thirty new batteries whose initial capacity was determined under the reference conditions of discharge rate, $C_{20}$, and temperature, 25° C. The $C_{20}$ rate is determined as the ampere-hour battery capacity divided by twenty hours: therefore calculating the $C_{20}$ rate results in 69 Ah/20 h=3.45 Amps for the particular model of battery utilized. FIG. 15 shows a plot of the thirty discharge curves from which an average amp-hour capacity of 63.37±1.23 Ah was determined. In the present test procedure, each battery was then deep-cycled no more than six times, and a final low-rate capacity test procedure performed on a portion of the batteries. The average level of capacity decline at the twenty-hour discharge rate was determined to be approximately 1.529 Ah per deep-discharge cycle. It will be readily apparent that estimations of battery SOC are improved by accounting for the amount of deep-discharge cycling to which the battery has been subjected.

Accordingly, it will be seen that this invention provides a battery charge state estimation method that may be utilized in a variety of electrical power management systems. It should be recognized that the method may be implemented with numerous variations obvious to those skilled in the art. In particular it should be recognized that specific thresholds, and intervals were often instantiated to provide a comparative standard although the values themselves could otherwise be wide-ranging.

Although the description above contains many specificities, these should not be construed as limiting the scope of the invention but as merely providing illustrations of some of the presently preferred embodiments of this invention. Thus the scope of this invention should be determined by the appended claims and their legal equivalents. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiments that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

TABLE 1

Estimated Charge Correction Factor $\eta_c$ as a Function of Temperature, Normalized Charging Current, and Battery SOC

| Temp. | SOC | Normalized Charging Current, $\phi_c$ | | | | |
|---|---|---|---|---|---|---|
| | | 0.05 | 0.10 | 0.20 | 0.50 | 1.00 |
| 25° C. | 100% | 0.031 | 0.015 | 0.008 | 0.003 | 0.002 |
| | 95% | 0.096 | 0.048 | 0.024 | 0.010 | 0.005 |
| | 90% | 0.320 | 0.160 | 0.080 | 0.032 | 0.016 |
| | 85% | 1.000 | 0.570 | 0.285 | 0.114 | 0.057 |
| | 80% | 1.000 | 1.000 | 1.000 | 0.439 | 0.220 |
| | 75% | 1.000 | 1.000 | 1.000 | 1.000 | 0.924 |
| | 70% | 1.000 | 1.000 | 1.000 | 1.000 | 1.000 |
| 50° C. | 100% | 0.010 | 0.005 | 0.002 | 0.001 | 0.000 |
| | 95% | 0.035 | 0.018 | 0.009 | 0.004 | 0.002 |
| | 90% | 0.139 | 0.070 | 0.035 | 0.014 | 0.007 |
| | 85% | 0.595 | 0.298 | 0.149 | 0.060 | 0.030 |
| | 80% | 1.000 | 1.000 | 0.696 | 0.278 | 0.139 |

TABLE 1-continued

Estimated Charge Correction Factor $\eta_c$ as a Function of Temperature, Normalized Charging Current, and Battery SOC

| Temp. | SOC | Normalized Charging Current, $\phi_c$ | | | | |
|---|---|---|---|---|---|---|
| | | 0.05 | 0.10 | 0.20 | 0.50 | 1.00 |
| | 75% | 1.000 | 1.000 | 1.000 | 1.000 | 0.719 |
| | 70% | 1.000 | 1.000 | 1.000 | 1.000 | 1.000 |

TABLE 2

Physical Regimes Providing Different Discharge Correction Factors

| Condition | Reason |
|---|---|
| $\eta_d > 1.0$ | SOC decreases faster than current-time integration due to low kinetic rate, less effective mass transfer and/or rapid volume expansion ([Equation]) resulting in physical blockage. |
| $\eta_d = 1.0$ | SOC is determined directly from current-time integration. |
| $\eta_d < 10$ | SOC decreases slower than current-time integration possible due to certain improvement in kinetic and/or mass-transfer rates. |

TABLE 3A

Discharge Correction Factors ($\leq 0°$ C.)

| Temp. | Discharge Current | | | | | | | | | |
|---|---|---|---|---|---|---|---|---|---|---|
| | 3.45 A | | 10.0 A | | 25.0 A | | 35.0 A | | 45.0 A | |
| ° C. | SOC % | $\eta_d$ | SOC % | $\eta_d$ | SOC % | $\eta_d$ | SOC % | $\eta_d$ | SOC % | $\eta_d$ |
| −29 | 88.8 | 1.343 | 87.9 | 1.441 | 88.6 | 1.416 | 87.6 | 1.297 | 88.3 | 1.414 |
| | 77.7 | 1.288 | 75.9 | 1.413 | 77.1 | 1.396 | 75.2 | 1.297 | 76.5 | 1.417 |
| | 66.5 | 1.135 | 63.8 | 1.258 | 65.7 | 1.311 | 62.9 | 1.188 | 64.8 | 1.329 |
| | 44.2 | 0.813 | 39.7 | 0.961 | 42.8 | 0.846 | 38.1 | 0.639 | 41.3 | 0.924 |
| | 21.9 | 0.605 | 15.6 | — | 19.9 | — | 13.3 | — | 17.8 | — |
| −18 | 88.8 | 1.321 | 87.9 | 1.533 | 88.6 | 1.645 | 87.6 | 1.499 | 88.3 | 1.660 |
| | 77.7 | 1.304 | 75.9 | 1.424 | 77.1 | 1.614 | 75.2 | 1.385 | 76.5 | 1.594 |
| | 66.5 | 1.279 | 63.8 | 1.396 | 65.7 | 1.594 | 62.9 | 1.377 | 64.8 | 1.592 |
| | 44.2 | 1.291 | 39.7 | 1.651 | 42.8 | 2.017 | 38.1 | 1.698 | 41.3 | 2.161 |
| | 21.9 | 1.408 | 15.6 | — | 19.9 | — | 13.3 | — | 17.8 | — |
| 0 | 88.8 | 1.055 | 87.9 | 1.225 | 88.6 | 1.283 | 87.6 | 1.337 | 88.3 | 1.387 |
| | 77.7 | 1.047 | 75.9 | 1.160 | 77.1 | 1.210 | 75.2 | 1.223 | 76.5 | 1.265 |
| | 66.5 | 1.017 | 63.8 | 1.120 | 65.7 | 1.185 | 62.9 | 1.140 | 64.8 | 1.206 |
| | 44.2 | 0.947 | 39.7 | 1.035 | 42.8 | 1.050 | 38.1 | 0.918 | 41.3 | 1.058 |
| | 21.9 | 0.868 | 15.6 | 0.600 | 19.9 | 0.447 | 13.3 | — | 17.8 | — |

TABLE 3A

Discharge Correction Factors ($\leq 0°$ C.)

| Temp. | Discharge Current | | | | | | | | | |
|---|---|---|---|---|---|---|---|---|---|---|
| | 3.45 A | | 10.0 A | | 25.0 A | | 35.0 A | | 45.0 A | |
| ° C. | SOC % | $\eta_d$ | SOC % | $\eta_d$ | SOC % | $\eta_d$ | SOC % | $\eta_d$ | SOC % | $\eta_d$ |
| 25 | 99.3 | 1.000 | 88.8 | 1.023 | 88.8 | 1.068 | 88.6 | 1.083 | 88.6 | 1.064 |
| | 91.0 | 1.000 | 77.7 | 1.040 | 77.7 | 1.119 | 77.1 | 1.091 | 77.1 | 1.108 |
| | 78.4 | 1.000 | 66.5 | 1.032 | 66.5 | 1.034 | 65.7 | 1.096 | 65.7 | 1.416 |

TABLE 3A-continued

Discharge Correction Factors (≤0° C.)

| Temp. | Discharge Current | | | | | | | | | |
|---|---|---|---|---|---|---|---|---|---|---|
| | 3.45 A | | 10.0 A | | 25.0 A | | 35.0 A | | 45.0 A | |
| ° C. | SOC % | $\eta_d$ | SOC % | $\eta_d$ | SOC % | $\eta_d$ | SOC % | $\eta_d$ | SOC % | $\eta_d$ |
| | 45.6 | 1.000 | 44.2 | 1.013 | 44.2 | 1.091 | 42.8 | 1.086 | 42.8 | 0.914 |
| | 28.1 | 1.000 | 21.9 | 1.056 | 21.9 | 1.073 | 19.9 | 0.969 | 19.9 | — |
| 52 | 88.8 | 0.880 | 87.9 | 0.946 | 88.6 | 0.958 | 87.6 | 0.819 | 88.3 | 1.009 |
| | 77.7 | 0.861 | 75.9 | 0.858 | 77.1 | 0.927 | 75.2 | 0.757 | 76.5 | 0.943 |
| | 66.5 | 0.856 | 63.8 | 0.934 | 65.7 | 0.951 | 62.9 | 0.739 | 64.8 | 0.998 |
| | 44.2 | 0.803 | 39.7 | 0.754 | 42.8 | 0.829 | 38.1 | 0.584 | 41.3 | 0.812 |
| | 21.9 | 0.731 | 15.6 | 0.953 | 19.9 | 0.915 | 13.3 | 0.162 | 17.8 | — |

TABLE 4

Peukert Regression Coefficients

| Temp. ° C. | $\gamma_0$ | $\gamma_1$ | $\gamma_2$ |
|---|---|---|---|
| −29 | 0.2244 | 0.3507 | −0.0753 |
| −18 | 0.2707 | 0.3811 | −0.1043 |
| 0 | 0.4524 | 0.4410 | −0.1450 |
| 25 | 0.6365 | 0.7337 | −0.1235 |
| 52 | 0.8281 | 0.7298 | −0.0920 |

What is claimed is:

1. A method for determining dynamic state-of-charge of a battery subject to periodic charging and discharging, comprising:
   (a) empirically deriving a correction factor $\eta$, under various operational conditions, which describe the efficiency of current transfer with the battery;
   (b) measuring the charge currents and discharge currents to which the battery is being subjected;
   (c) establishing a time interval relating to said charge and discharge currents, such that the associated ampere-hours may be calculated; and
   (d) calculating a dynamic state-of-charge value for the battery by incrementally applying said correction factor $\eta$ to each ampere-hour increment to update an existing state-of-charge value.

2. A method as recited in claim 1, wherein said correction factor $\eta$ is determined according to operating conditions comprising: temperature, current level, and state-of-charge.

3. A method of determining dynamic state-of-charge within a battery that is subject to periodic charging and discharging, comprising:
   (a) determining a set of parameters from which a correction factor $\eta$ may be calculated for the battery under operational conditions based on data collected from testing of a set of reference batteries, wherein said correction factor $\eta$ expresses the level of effective current transfer with the battery under a given set of conditions;
   (b) calculating a correction factor $\eta$ for a given operational condition from said set of parameters; and
   (c) applying said correction factor $\eta$ to the calculation of $\Delta SOC=(\eta \times i \times \Delta t)/Q_n$ to update the state-of-charge (SOC) under the present operating conditions such that the correction factor $\eta$ is thereby factored into currents i being applied to and received from said battery which are tracked over a period of time $\Delta t$ in relation to nominal battery capacity $Q_n$ to provide a state-of-charge value for the battery.

4. A method as recited in claim 3, wherein the operational conditions of the battery comprise operating temperature, current flow, and state-of-charge.

5. A method as recited in claim 3, wherein the calculation of the correction factor $\eta$ is performed in real-time according to the operational conditions based on a set of parameters which have been stored for later retrieval.

6. A method as recited in claim 5, wherein the calculation of correction factor $\eta$ during charging is performed based on stored characteristic parameters for the battery according to a method comprising:
   (a) normalizing the charge current to the battery capacity;
   (b) looking up stored parameters $\alpha_0$ and $\alpha_1$ at the present temperature;
   (c) calculating the critical point $\phi_{critical}=e^{\alpha_0+\alpha_1 ln\phi}$; and
   (d) calculating a correction factor $\eta=\phi_{critical}/\phi_{normal}$ when the value of charge current exceeds the critical current for the conditions and using a correction factor of one otherwise.

7. A method as recited in claim 5, wherein the calculation of the correction factor $\eta$ during discharging is performed based on stored characteristic parameters for the battery according to the method comprising:
   (a) normalizing the discharge current to battery capacity;
   (b) looking up stored parameters $\gamma_0$, $\gamma_1$, $\gamma_2$, at the present temperature; and
   (c) calculating a correction factor $\eta=\gamma_0+\gamma_1 ln\phi+\gamma_2 ln\phi$, wherein $\phi$ is the discharge current and $\phi$ is the present state-of-charge.

8. A method as recited in claim 3, wherein the determination of parameters and the calculation of the correction factor $\eta$ are not performed in real-time, such that a plurality of correction factors $\eta$ is calculated and stored according to operational conditions which are then retrieved for application to the SOC calculation under actual conditions in real-time.

9. A method as recited in claim 8, wherein the determination of parameters and calculation of a correction factor $\eta$ for use during battery charging for a given operational condition is performed according to the method comprising:
   (a) discharging a reference set of batteries whose characteristics are similar to said battery, at a predetermined constant first discharge current to a first state-of-charge level;
   (b) charging the reference batteries at a constant charging current and recording charging voltage profiles in reference to estimated battery state-of-charge;
   (c) determining the state-of-charge $\phi$ for which the onset-of-overcharge condition occurs;

(d) determining empirical coefficients $\alpha_0$, and $\alpha_1$, for the equation $\ln\phi_{critical}=\alpha_0+\alpha_1 \ln\phi$ at a given temperature wherein $\phi_{critical}$ is the normalized critical current;

(e) calculating the critical point $\phi_{critical}=e^{\alpha_0+\alpha_1 ln\phi}$; and (f) calculating a correction factor $\eta=\phi_{critical}/\phi_{normal}$ when the value of charge current exceeds the critical current for the conditions and using a correction factor of one otherwise, wherein said correction factor $\eta$ is stored according to operational condition for application in real-time to update the state-of-charge value for the battery.

10. A method as recited in claim 9, wherein the charging is performed after a rest interval such that the batteries are allowed to achieve a desired equilibrium state.

11. A method as recited in claim 9, wherein the onset-of-overcharge is calculated from an inflection point within a voltage profile as a function of state-of-charge.

12. A method as recited in claim 9, wherein the onset-of-overcharge is determined to occur when a monitored level of gas flow rate exceeds a redetermined threshold condition.

13. A method as recited in claim 8, wherein the determination of parameters and calculation of a correction factor $\eta$ for use during battery discharging for a given operational condition is performed according to the method comprising:

(a) discharging a reference battery, maintained at a first temperature (reference), at a predetermined first discharge current until a predetermined first state-of-charge (SOC) level is attained and record the ampere-hours removed as $Q_1$;

(b) calculating estimated remaining capacity $Q_2=Q_n-Q_1$ such that the capacity $Q_1$ is subtracted from the stated nominal battery capacity $Q_n$;

(c) resting said reference battery within a first rest period of sufficient duration to achieve a desired equilibrium state;

(d) discharging said reference battery at a predetermined second test current until the measured battery voltage reaches a predetermined final discharge voltage $V_f$ and recording the amp-hour capacity thereby removed as $Q_3$;

(e) resting said reference battery within a second rest period of sufficient duration to achieve a desired equilibrium state;

(f) discharging said reference battery at the predetermined first discharge current down to the predetermined final discharge voltage $V_f$ and record the amp-hour capacity thereby removed as $Q_4$; and (g) calculating a discharge correction factor estimate $\eta_d\cong(Q_2-Q_4)/Q_3$ such that $(Q_2-Q_4)$ represents the expected capacity available under the reference conditions, wherein said correction factor $\eta$ is stored according to operational conditions for application in real-time to update the state-of-charge value for the battery.

14. A method as recited in claim 13, wherein the first discharge current is set to the $C_{20}$-rate of discharge for the battery.

15. A method as recited in claim 13, wherein the correction factor $\eta$ is determined at a predetermined second temperature such that the test further includes resting said battery within the first rest period for an additional time period at the second temperature, and wherein the discharging of step (d) is performed at said second temperature, thereafter in step (e) the battery is returned to the first temperature and allowed to rest for a sufficient time period so as to achieve a desired state of temperature equilibrium, and wherein the correction factor $\eta$ may be determined at additional predetermined temperatures.

16. A method as recited in claim 15, wherein if the predetermined second temperature is less below 0° C., then the length of the rest period is approximately doubled in comparison to that used at the first temperature (reference).

17. A method as recited in claim 13, wherein during a portion of the rest interval a small current load is connected to the battery which simulates parasitic loading of the battery under operating conditions.

18. A method as recited in claim 13, further comprising calculating nominal battery capacity for the battery which is responsive to the decrease of battery capacity as a result of deep-discharge cycling.

19. A method as recited in claim 8, wherein the determination of parameters and calculation of a correction factor $\eta$ for use during battery discharging for a given operational condition is performed according to a method comprising:

(a) discharging a first battery, maintained at a first temperature (reference), at a predetermined first discharge current until a predetermined first battery condition is reached and recording the ampere-hours removed as $Q_1$;

(b) discharging additional capacity from said first battery until an end of discharge threshold is reached while recording the ampere-hours removed as $Q_2$;

(c) discharging a second battery, maintained at a first temperature (reference), at a predetermined first discharge current until said predetermined first battery condition is reached;

(d) discharging of said second battery under an operational condition of temperature and discharge rate while recording the ampere-hours removed as $Q_3$;

(e) discharging additional capacity from said second battery until the end of discharge threshold is reached while recording the ampere-hours removed as $Q_4$; and (f) calculating a discharge correction factor $\eta_d\cong(Q_2-Q_4)/Q_3$ which is stored according to operational conditions.

20. An Apparatus for determining dynamic state-of-charge of a battery subject to periodic charging and discharging, comprising:

(a) means for empirically deriving a correction factor $\eta$, under various operational conditions, which describe the efficiency of current transfer with the battery;

(b) means for measuring the charge currents and discharge currents to which the battery is being subjected;

(c) means for establishing a time interval relating to said charge and discharge currents, such that the associated ampere-hours may be calculated; and (d) means for calculating a dynamic state-of-charge value for the battery by incrementally applying said correction factor $\eta$ to each ampere-hour increment to update an existing state-of-charge value.

21. An apparatus as recited in claim 20, wherein said correction factor $\eta$ is determined according to operating conditions comprising: temperature, current level, and state-of-charge.

22. An apparatus for determining dynamic state-of-charge within a battery that is subject to periodic charging and discharging, comprising:

(a) means for determining a set of parameters from which a correction actor $\eta$ may be calculated for the battery under operational conditions based on data collected from testing of a set of reference batteries, wherein said correction factor $\eta$ expresses the level of effective current transfer with the battery under a given set of conditions;

(b) means for calculating a correction factor η for a given operational condition from said set of parameters; and (c) means for applying said correction factor η to the calculation of $\Delta SOC=(\eta \times i \times \Delta t)/Q_n$ to update the state-of-charge (SOC) under the present operating conditions such that the correction factor η is thereby factored into currents i being applied to and received from said battery which are tracked over a period of time $\Delta t$ in relation to nominal battery capacity $Q_n$ to provide a state-of-charge value for the battery.

23. An apparatus as recited in claim 22, wherein the operational conditions of the battery comprise operating temperature, current flow, and state-of-charge.

24. An apparatus as recited in claim 22, wherein the calculation of the correction factor η is performed in real-time according to the operational conditions based on a set of parameters which have been stored for later retrieval.

25. An method as recited in claim 24, wherein the calculation of correction factor η during charging is performed based on stored characteristic parameters for the battery according to a method comprising:

(a) normalizing the charge current to the battery capacity;

(b) looking up stored parameters $\alpha_0$ and $\alpha_1$ at the present temperature;

(c) calculating the critical point $\phi_{critical}=e^{\alpha_0+\alpha_1 ln\phi}$; and (d) calculating a correction factor $\eta=\phi_{critical}/\phi_{normal}$ when the value of charge current exceeds the critical current for the conditions and using a correction factor of one otherwise.

26. An apparatus as recited in claim 24, wherein the calculation of the correction factor η during discharging is performed based on stored characteristic parameters for the battery according to the method comprising:

(a) normalizing the discharge current to battery capacity;

(b) looking up stored parameters $\gamma_0, \gamma_1, \gamma_2$, at the present temperature; and (c) calculating a correction factor $\eta=\gamma_0+\gamma_1 \ln\phi+\gamma_2 \ln\phi$, wherein φ is the discharge current and φ is the present state-of-charge.

27. An apparatus as recited in claim 22, wherein the determination of parameters and the calculation of the correction factor η are not performed in real-time, such that a plurality of correction factors η is calculated and stored according to operational conditions which are then retrieved for application to the SOC calculation under actual conditions in real-time.

28. An apparatus as recited in claim 27, wherein the determination of parameters and calculation of a correction factor η for use during battery charging for a given operational condition is performed according to the method comprising:

(a) discharging a reference set of batteries whose characteristics are similar to said battery, at a predetermined constant first discharge current to a first state-of-charge level;

(b) charging the reference batteries at a constant charging current and recording charging voltage profiles in reference to estimated battery state-of-charge;

(c) determining the state-of-charge φ for which the onset-of-overcharge condition occurs;

(d) determining empirical coefficients $\alpha_0$, and $\alpha_1$, for the equation $\ln\phi_{critical}=\alpha_0+\alpha_1 \ln\phi$ at a given temperature wherein $\phi_{critical}$ is the normalized critical current;

(e) calculating the critical point $\phi_{critical}=e^{\alpha_0\alpha_1 ln\phi}$; and (f) calculating a correction factor $\eta_{critical}/\phi_{normal}$ when the value of charge current exceeds the critical current for the conditions and using a correction factor of one otherwise, wherein said correction factor η is stored according to operational condition for application in real-time to update the state-of-charge value for the battery.

29. An apparatus as recited in claim 28, wherein the charging is performed after a rest interval such that the batteries are allowed to achieve a desired equilibrium state.

30. An apparatus as recited in claim 28, wherein the onset-of-overcharge is calculated from an inflection point within a voltage profile as a function of state-of-charge.

31. An apparatus as recited in claim 28, wherein the onset-of-overcharge is determined to occur when a monitored level of gas flow rate exceeds a predetermined threshold condition.

32. An apparatus as recited in claim 27, wherein the determination of parameters and calculation of a correction factor η for use during battery discharging for a given operational condition is performed according to the method comprising:

(a) discharging a reference battery, maintained at a first temperature (reference), at a predetermined first discharge current until a predetermined first state-of-charge (SOC) level is attained and record the ampere-hours removed as $Q_1$;

(b) calculating estimated remaining capacity $Q_2=Q_n-Q_1$ such that the capacity $Q_1$ is subtracted from the stated nominal battery capacity $Q_n$;

(c) resting said reference battery within a first rest period of sufficient duration to achieve a desired equilibrium state;

(d) discharging said reference battery at a predetermined second test current until the measured battery voltage reaches a predetermined final discharge voltage $V_f$ and recording the amp-hour capacity thereby removed as $Q_3$;

(e) resting said reference battery within a second rest period of sufficient duration to achieve a desired equilibrium state;

(f) discharging said reference battery at the predetermined first discharge current down to the predetermined final discharge voltage $V_f$ and record the amp-hour capacity thereby removed as $Q_4$; and (g) calculating a discharge correction factor estimate $\eta_n \approx (Q_2-Q_4)/Q_3$ such that $(Q_2-Q_4)$ represents the expected capacity available under the reference conditions, wherein said correction factor η is stored according to operational conditions for application in real-time to update the state-of-charge value for the battery.

33. An apparatus as recited in claim 32, wherein the first discharge current is set to the $C_{20}$-rate of discharge for the battery.

34. An apparatus as recited in claim 32, wherein the correction factor η is determined at a predetermined second temperature such that the test further includes resting said battery within the first rest period for an additional time period at the second temperature, and wherein the discharging of step (d) is performed at said second temperature, thereafter in step (e) the battery is returned to the first temperature and allowed to rest for a sufficient time period so as to achieve a desired state of temperature equilibrium, and wherein the correction factor η may be determined at additional predetermined temperatures.

35. An apparatus as recited in claim 34, wherein if the predetermined second temperature is less below 0° C., then the length of the rest period is approximately doubled in comparison to that used at the first temperature (reference).

36. An apparatus as recited in claim 32, wherein during a portion of the rest interval a small current load is connected to the battery which simulates parasitic loading of the battery under operating conditions.

37. An apparatus as recited in claim 32, further comprising calculating nominal battery capacity for the battery which is responsive to the decrease of battery capacity as a result of deep-discharge cycling.

38. An apparatus as recited in claim 27, wherein the determination of parameters and calculation of a correction factor η for use during battery discharging for a given operational condition is performed according to a method comprising:

(a) discharging a first battery, maintained at a first temperature (reference), at a predetermined first discharge current until a predetermined first battery condition is reached and recording the ampere-hours removed as $Q_1$;

(b) discharging additional capacity from said first battery until an end of discharge threshold is reached while recording the ampere-hours removed as $Q_2$;

(c) discharging a second battery, maintained at a first temperature (reference), at a predetermined first discharge current until said predetermined first battery condition is reached;

(d) discharging of said second battery under an operational condition of temperature and discharge rate while recording the ampere-hours removed as $Q_3$;

(e) discharging additional capacity from said second battery until the end of discharge threshold is reached while recording the ampere-hours removed as $Q_4$; and (f) calculating a discharge correction factor $\eta_d \cong (Q_2-Q_4)/Q_3$ which is stored according to operational conditions.

* * * * *